United States Patent
Sato

(10) Patent No.: US 6,824,956 B2
(45) Date of Patent: Nov. 30, 2004

(54) POSITIVE RESIST COMPOSITION

(75) Inventor: Kenichiro Sato, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 111 days.

(21) Appl. No.: 10/369,638

(22) Filed: Feb. 21, 2003

(65) Prior Publication Data

US 2003/0194640 A1 Oct. 16, 2003

(30) Foreign Application Priority Data

Feb. 21, 2002 (JP) ................................. P.2002-044665

(51) Int. Cl.$^7$ ............................................... G03F 7/004
(52) U.S. Cl. ................................. 430/270.1; 430/910
(58) Field of Search ........................... 430/270.1, 910, 430/905

(56) References Cited

U.S. PATENT DOCUMENTS

| | | | | | |
|---|---|---|---|---|---|
| 2002/0156199 A1 | * | 10/2002 | Sheehan et al. | ......... | 525/327.1 |
| 2003/0180662 A1 | * | 9/2003 | Nakano | ......... | 430/270.1 |
| 2003/0199641 A1 | * | 10/2003 | Sheehan et al. | ......... | 525/330.6 |

FOREIGN PATENT DOCUMENTS

| JP | 9-73173 | 3/1997 |
|---|---|---|
| JP | 10-161313 | 6/1998 |
| JP | 2000-137327 | 5/2000 |
| JP | 2001-109154 | 4/2001 |
| JP | 2001-183836 | 7/2001 |

\* cited by examiner

Primary Examiner—Rosemary Ashton
(74) Attorney, Agent, or Firm—Sughrue Mion, PLLC

(57) ABSTRACT

A positive resist composition comprising: (A) a resin which comprises a repeating unit represented by the following formula (I):

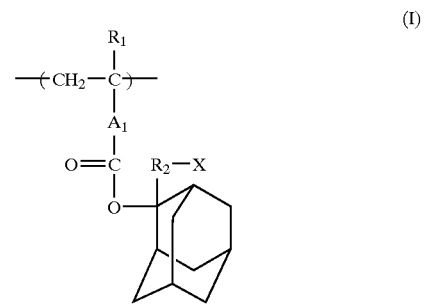

(I)

wherein $R_1$ represents a hydrogen atom or an alkyl group, $A_1$ represents a single bond or a linking group, $R_2$ represents an alkylene group, and X represents an alkoxy group or a hydroxyl group, and exhibits an increased rate of dissolution in an alkali developing solution by an action of an acid; and (B) a compound capable of generating an acid on exposure to active light rays or a radiation.

11 Claims, No Drawings

POSITIVE RESIST COMPOSITION

FIELD OF THE INVENTION

This invention relates to a far ultraviolet-sensitive positive resist composition which can be used for micro-patterning in, e.g., semiconductor device fabrication. More particularly, it relates to a positive resist composition which is adapted to be exposed to far ultraviolet rays.

BACKGROUND OF THE INVENTION

In recent years, ICs have ever been increasing the degree of integration. Fabrication of semiconductor devices for very large scale integration (VLSI), etc. now needs ultrafine patterning technology to achieve line widths of half micron or even smaller. To meet the demand, the wavelengths of aligners used for optical lithography have been getting shorter and shorter. Today, it is studied to use excimer laser (e.g., XeCl, KrF or ArF) light beams having shorter wavelengths in the far ultraviolet region.

A chemically amplified resist is used in lithographic patterning using such short wavelengths. While a chemically amplified resist is generally suited to be exposed to ultraviolet rays or far ultraviolet rays, it is required to satisfy requirements specific to the aligner used. Where KrF excimer laser light having a wavelength of 248 nm is used, for example, a resist composition containing a hydroxystyrene resin having an acetal or ketal group as a protective group has been proposed for its low light absorption. Although the composition is fit for exposure to KrF excimer laser light having a wavelength of 248 nm, it has low sensitivity to ArF excimer laser light having a wavelength of 193 nm on account of its essentially too large absorbance at 193 nm. The low sensitivity to ArF excimer laser light is accompanied with other disadvantages, such as reduced resolving power, reduced depth of focus (DOF) and deteriorated pattern profile. There remains much room for improvement in the composition proposed.

Resins having an alicyclic hydrocarbon moiety introduced thereto have been proposed for the purpose of imparting dry etching resistance to photoresist compositions for ArF laser light. The resins include those obtained by copolymerizing a monomer having a carboxylic acid (e.g., acrylic acid or methacrylic acid) moiety or a monomer having a hydroxyl group or a cyano group in the molecule with a monomer having an alicyclic hydrocarbon group.

JP-A-9-73173 (The term "JP-A" as used herein means an "unexamined published Japanese patent application") and JP-A-10-161313 disclose a resist material containing an acid-responsive compound having an alkali-soluble group which is protected with an alicyclic group-containing structure and a structural unit which makes the alkali-soluble group be released by the action of an acid thereby to render the compound alkali-soluble.

JP-A-2000-137327 discloses a resist composition containing a resin having an adamantyl-containing repeating unit in an attempt to improve sensitivity, resolution, and adhesion to a substrate.

JP-A-2001-183836 proposes a resist composition exhibiting satisfactory resist performance and improved wettability by an alkali developing solution, which contains a resin comprising a repeating unit carrying an acid-labile group having an adamantyl group and a repeating unit carrying an adamantyl group substituted with two hydroxyl groups.

JP-A-2001-109154 teaches a resist composition containing a resin having a repeating unit having an alicyclic lactone structure in an attempt to improve sensitivity, resolution, and line edge roughness.

However, none of these related arts succeeds in sufficiently improving line edge roughness. "Line edge roughness (LER)" means irregularities of edges of lines patterned in the resist as observed in the direction perpendicular to the lines. When seen right from above, a line pattern shows a roughness of plus or minus several tens of nanometers with respect to a reference line. Since LER is transferred to the substrate on etching, large LER leads to deterioration of electrical characteristics, resulting in a reduced yield. Reduction of a resist pattern size below a quarter micron has being boosting the demand to reduce LER.

SUMMARY OF THE INVENTION

An object of the present invention is to provide a positive resist composition which provides a resist pattern with markedly reduced LER and is suitable to a supermicrolithographic process and other photofabrication processes in the fabrication of VLSIs, high capacity microchips, etc.

The present inventors have conducted extensive studies on materials of a chemically amplified positive resist composition and found as a result that the object of the invention is accomplished by:

(1) A positive resist composition comprising (A) a resin which contains a repeating unit represented by formula (I):

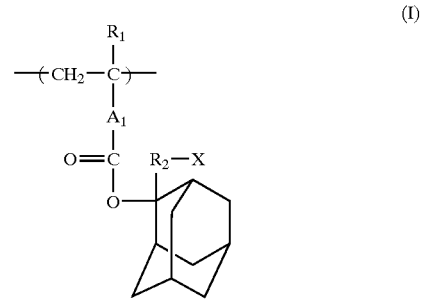

wherein $R_1$ represents a hydrogen atom or an alkyl group; $A_1$ represents a single bond or a linking group; $R_2$ represents an alkylene group; and X represents an alkoxy group or a hydroxyl group, and exhibits an increased rate of dissolution in an alkali developing solution by the action of an acid and (B) a compound capable of generating an acid on exposure to active light rays or a radiation.

(2) The positive resist composition according to (1), wherein the resin (A) comprises a repeating unit represented by formula (II):

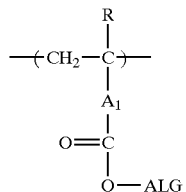

(II)

wherein R represents a hydrogen atom or a methyl group; $A_2$ represents a single bond or a linking group; and ALG represents an alicyclic hydrocarbon group-containing group represented by formula (pI), (pII), (pIII), (pIV) or (pV):

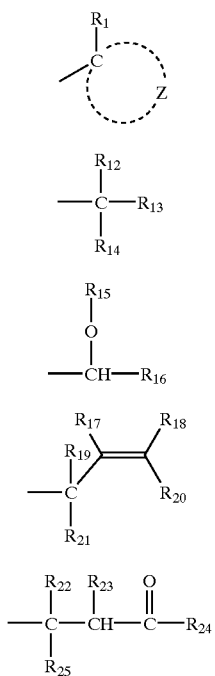

(pI)

(pII)

(pIII)

(pIV)

(pV)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the adjacent carbon atom; $R_{12}$, $R_{13}$, $R_{14}$, $R_{15}$, and $R_{16}$ each represent a straight-chain or branched alkyl group having 1 to 4 carbon atoms or an alicyclic hydrocarbon group, provided that at least one of $R_{12}$, $R_{13}$, and $R_{14}$ and at least one of $R_{15}$ and $R_{16}$ represent an alicyclic hydrocarbon group; $R_{17}$, $R_{18}$, $R_{19}$, $R_{20}$, and $R_{21}$ each represent a hydrogen atom, a straight-chain or branched alkyl group having 1 to 4 carbon atoms or an alicyclic hydrocarbon group, provided that at least one of $R_{17}$, $R_{18}$, $R_{19}$, $R_{20}$, and $R_{21}$ represents an alicyclic hydrocarbon group and that at least one of $R_{19}$ and $R_{21}$ represents a straight-chain or branched alkyl group having 1 to 4 carbon atoms or an alicyclic hydrocarbon group; and $R_{22}$, $R_{23}$, $R_{24}$, and $R_{25}$ each represent a straight-chain or branched alkyl group having 1 to 4 carbon atoms or an alicyclic hydrocarbon group, provided that at least one of $R_{22}$, $R_{23}$, $R_{24}$, and $R_{25}$ represents an alicyclic hydrocarbon group; and $R_{23}$ and $R_{24}$ may be connected together to form a ring.

(3) The positive resist composition according to (1) or (2), wherein the resin (A) further comprises a repeating unit represented by formula (III):

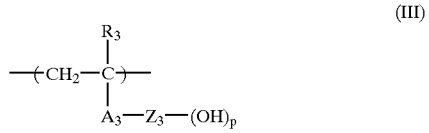

(III)

wherein $R_3$ represents a hydrogen atom or a methyl group; $A_3$ represents a single bond or a divalent linking group; $Z_3$ represents an alicyclic hydrocarbon group having a valence of (p+1); and p represents an integer of 1 to 3.

(4) The positive resist composition according to (1), (2) or (3), wherein the resin (A) further comprises a repeating unit having a cyclohexane lactone moiety, a norbornane lactone moiety or an adamantane lactone moiety.

(5) The positive resist composition according to (3), wherein the repeating unit represented by formula (III) is a repeating unit represented by formula (IIIa):

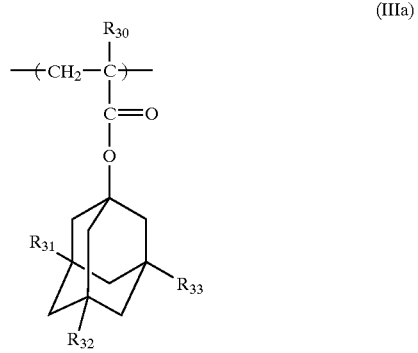

(IIIa)

wherein $R_{30}$ represents a hydrogen atom or a methyl group; and $R_{31}$, $R_{32}$, and $R_{33}$ each represent a hydrogen atom, a hydroxyl group or an alkyl group, provided that at least one of $R_{31}$, $R_{32}$, and $R_{33}$ is a hydroxyl group.

(6) The positive resist composition according to (5), wherein at least two of $R_{31}$, $R_{32}$, and $R_{33}$ each represent a hydroxyl group.

(7) The positive resist composition according to (2), wherein, in formula (II), $A_2$ is a single bond, and ALG is a group represented by formula:

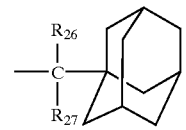

wherein $R_{26}$ and $R_{27}$ each represent a straight-chain or branched alkyl group having 1 to 4 carbon atoms.

(8) The positive resist composition according to any one of (1) to (7), wherein the resins (A) further comprises a repeating unit having a lactone moiety and represented by formula (IV)

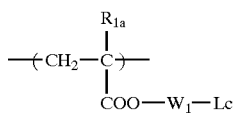
(IV)

wherein $R_{1a}$ represents a hydrogen atom or a methyl group; $W_1$ represents a single bond or one of, or a combination of two or more of, an alkylene group, an ether group, a thioether group, a carbonyl group, and an ester group; Lc represents a lactone structure of formula:

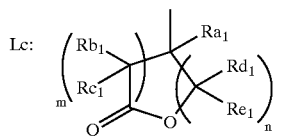

wherein $R_{a1}$, $R_{b1}$, $R_{c1}$, $R_{d1}$, and $R_{e1}$ each represent a hydrogen atom or an alkyl group having 1 to 4 carbon atoms; and m and n each represent an integer of 0 to 3, provided that m+n is 2 to 6.

DETAILED DESCRIPTION OF THE INVENTION

The resin as component (A) increases its rate of dissolution in an alkali developing solution by the action of an acid (hereinafter sometimes referred to as acid-degradable resin or simply as resin (A)). The resin (A) comprises a repeating unit of formula (I).

In formula (I), the alkyl group as $R_1$ may be either straight or branched and preferably includes a lower one having 1 to 5 carbon atoms, e.g., methyl, ethyl, or propyl.

The alkylene group as $R_2$ includes a group represented by formula: $-[C(R_b)(R_c)]_r-$, wherein $R_b$ and $R_c$, which may be the same or different, each represent a hydrogen atom, an alkyl group, a substituted alkyl group, a halogen atom, a hydroxyl group or an alkoxy group; and r represents an integer of 1 to 10, preferably 1 to 5. Where r is 2 or greater, $R_b$'s and $R_c$'S may be each the same or different. The alkyl group in the alkylene group is preferably a lower one having 1 to 5 carbon atoms, e.g., methyl, ethyl, propyl, isopropyl or butyl, still preferably methyl, ethyl, propyl or isopropyl. The substituent of the substituted alkyl group in the alkylene group includes a hydroxyl group, a halogen atom, and an alkoxy group (preferably one having 1 to 4 carbon atoms). The alkoxy group in the alkylene group is preferably one having 1 to 4 carbon atoms, e.g., methoxy, ethoxy, propoxy or butoxy. The halogen atom in the alkylene group includes chlorine, bromine, fluorine, and iodine.

The alkoxy group as X preferably includes one having 1 to 15 carbon atoms, particularly 1 to 10 carbon atoms, especially 1 to 5 carbon atoms, such as methoxy, ethoxy, propoxy, butoxy or pentoxy.

The linking group as $A_1$ is one of, or a combination of two or more of, an alkylene group, an ether group, a thioether group, a carbonyl group, an ester group, an amido group, a sulfonamido group, a urethane group, and a urea group. The details of the alkylene group as $R_2$ described above apply to that as $A_1$.

The repeating unit represented by formula (I) includes, but is not limited to, the following examples.

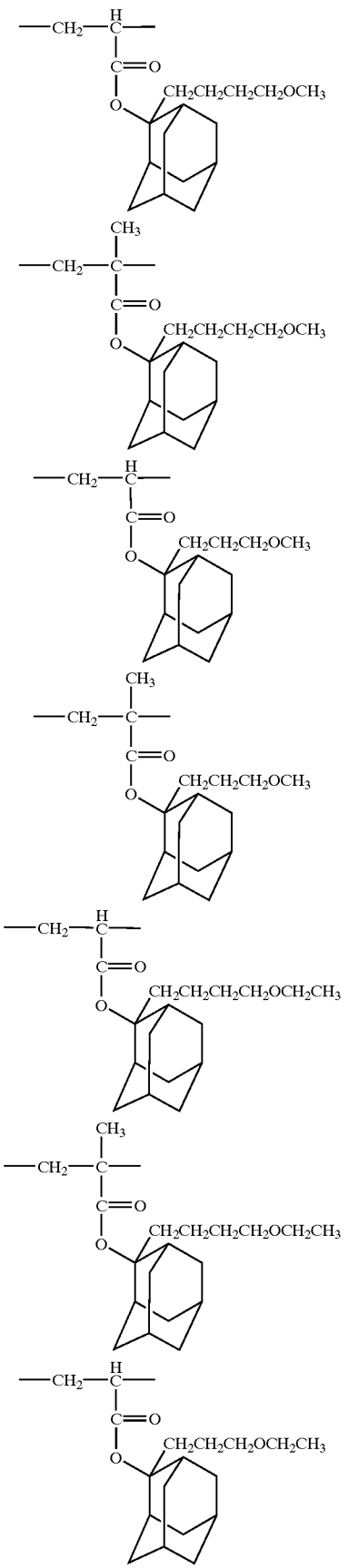

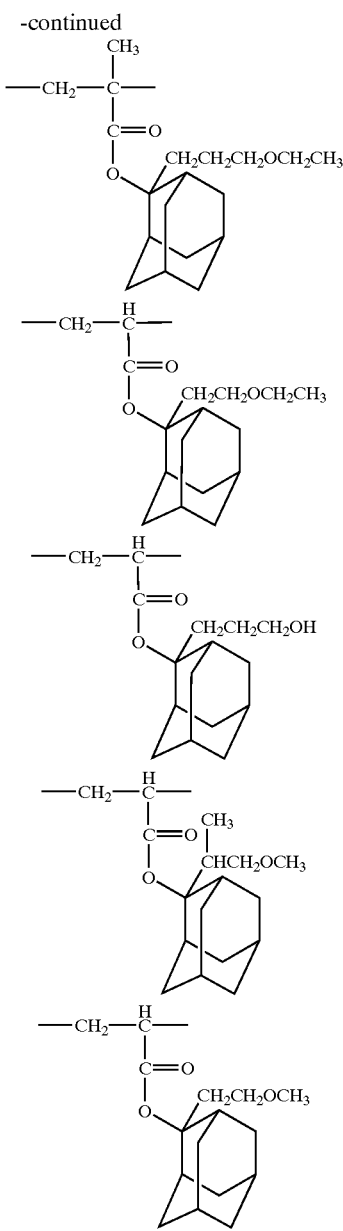

The acid-degradable resin of the invention preferably comprises another repeating unit having an acid-degradable group (a group decomposed by the action of an acid to become alkali soluble) in addition to the repeating unit of formula (I).

The acid-degradable group includes a —COOA$^0$ group and an —O—B$^0$ group, and a group containing such an acid-degradable group includes an —R$^0$—COOA$^0$ and an —Ar—O—B$^0$ group, wherein A$^0$ represents —C(R$^{01}$)(R$^{02}$)(R$^{03}$), —Si(R$^{01}$)(R$^{02}$)(R$^{03}$), —C(R$^{04}$)(R$^{05}$)—O—R$^{06}$ or a lactone group; B$^0$ represents —A$^0$ or —CO—O—A$^0$; R$^{01}$, R$^{02}$, R$^{03}$, R$^{04}$, and R$^{05}$, which may be the same or different, each represent a hydrogen atom, an alkyl group, a cycloalkyl group, an alkenyl group, an aralkyl group or an aryl group; R$^{06}$ represents an alkyl group, a cyclic alkyl group or an aryl group; provided that at least two of R$^{01}$, R$^{02}$, and R$^{03}$ represent substituents other than hydrogen atom and that two of R$^{01}$, R$^{02}$, and R$^{03}$ or two of R$^{04}$, R$^{05}$, and R$^{06}$ may be taken together to form a ring; R$^0$ represents a single bond or a substituted or unsubstituted aliphatic or aromatic hydrocarbon group having a valence of two or more; and —Ar— represents a substituted or unsubstituted monocyclic or polycyclic aromatic group having a valence of two or more.

In A$^0$, the alkyl group is preferably a lower one having 1 to 4 carbon atoms, such as methyl, ethyl, propyl, n-butyl, sec-butyl or t-butyl; the cycloalkyl group is preferably one having 3 to 30 carbon atoms, such as cyclopropyl, cyclobutyl, cyclohexyl or adamantyl; the alkenyl group is preferably one having 2 to 4 carbon atoms, such as vinyl, propenyl, allyl or butenyl; the aryl group is preferably one having 6 to 14 carbon atoms, such as phenyl, xylyl, toluyl, cumenyl, naphthyl or anthracenyl; the cyclic alkyl group includes one having 3 to 30 carbon atoms, such as cyclopropyl, cyclopentyl, cyclohexyl, adamantyl, norbornyl, bornyl, tricyclodecanyl, dicyclopentenyl, epoxynorbornyl, mentyl, isomentyl, neomentyl, tetracyclododecanyl or a steroid residue; and the aralkyl group includes a substituted or unsubstituted one having 7 to 20 carbon atoms, such as benzyl, phenethyl or cumyl.

The substituents include a hydroxyl group, a halogen atom (e.g., fluorine, chlorine, bromine or iodine), a nitro group, a cyano group, the above-recited alkyl group, an alkoxy group (e.g., methoxy, ethoxy, hydroxyethoxy, propoxy, hydroxypropoxy, n-butoxy, isobutoxy, sec-butoxy or t-butoxy), an alkoxycarbonyl group (e.g., methoxycarbonyl or ethoxycarbonyl), an aralkyl group (e.g., benzyl, phenethyl or cumyl), an aralkyloxy group, an acyl group (e.g., formyl, acetyl, butyryl, benzoyl, cinnamoyl or valeryl), an acyloxy group (e.g., butyryloxy), the above-recited alkenyl group, an alkenyloxy group (e.g., vinyloxy, propenyloxy, allyloxy or butenyloxy), the above-recited aryl group, an aryloxy group (e.g., phenoxy), and an aryloxycarbonyl group (e.g., benzoyloxy).

The lactone group includes the following structures:

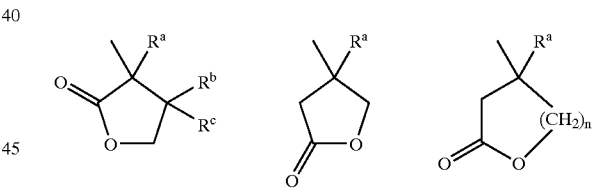

wherein R$^a$, R$^b$, and R$^c$ each represent a hydrogen atom or an alkyl group having 1 to 4 carbon atoms; and n represents an integer of 2 to 4.

Where an ArF excimer laser is used as an exposure light source, it is preferred to use an acid-degradable group of formula —C(=O)—X$_1$—R$_0$, wherein R$_0$ includes a tertiary alkyl group (e.g., t-butyl or t-amyl), an isobornyl group, a 1-alkoxyethyl group (e.g., 1-ethoxyethyl, 1-butoxyethyl, 1-isobutoxyethyl or 1-cyclohexyloxyethyl), an alkoxymethyl group (e.g., 1-methoxymethyl or 1-ethoxymethyl), a tetrahydropyranyl group, a tetrahydrofuranyl group, a trialkylsilyl group, a 3-oxocyclohexyl group, and the above-recited lactone group; and X$_1$ represents an oxygen atom or a sulfur atom, preferably an oxygen atom.

The acid-degradable group-containing repeating unit which is preferably used in combination with the repeating unit of formula (I) includes the one represented by formula (II).

In formula (II), R represents a hydrogen atom or a methyl group; $A_2$ represents a single atom or a linking group; and ALG represents an alicyclic hydrocarbon-containing group represented by formulae (pI) to (pV).

The linking group as $A_2$ is one of, or a combination of two or more of, an alkylene group, an ether group, a thioether group, a carbonyl group, an ester group, an amido group, a sulfonamido group, a urethane group, and a urea group. The alkylene group as $A_2$ includes a group represented by formula: $-[C(R_b)(R_c)]_r-$, wherein $R_b$ and $R_c$, which may be the same or different, each represent a hydrogen atom, an alkyl group, a substituted alkyl group, a halogen atom, a hydroxyl group or an alkoxy group; and r represents an integer of 1 to 10. The alkyl group in the alkylene group is preferably a lower one, e.g., methyl, ethyl, propyl, isopropyl or butyl, still preferably methyl, ethyl, propyl or isopropyl. The substituent of the substituted alkyl group in the alkylene group includes a hydroxyl group, a halogen atom, and an alkoxy group (preferably one having 1 to 4 carbon atoms). The alkoxy group in the alkylene group is preferably one having 1 to 4 carbon atoms, e.g., methoxy, ethoxy, propoxy or butoxy. The halogen atom includes chlorine, bromine, fluorine, and iodine.

In formulae (pI) to (pV), the alkyl group as $R_{12}$ to $R_{25}$ is a substituted or unsubstituted straight-chain or branched one having 1 to 4 carbon atoms, such as methyl, ethyl, n-propyl, isopropyl, n-butyl, isobutyl, sec-butyl or t-butyl. The substituent of the substituted alkyl group includes an alkoxy group having 1 to 4 carbon atoms, a halogen atom (e.g., fluorine, chlorine, bromine or iodine), an acyl group, an acyloxy group, a cyano group, a hydroxyl group, a carboxyl group, an alkoxycarbonyl group, and a nitro group.

The alicyclic hydrocarbon group as represented by $R_{12}$ to $R_{25}$ or as formed by Z and the adjacent carbon atom may be monocyclic or polycyclic and includes groups having a monocyclic, bicyclic, tricyclic, tetracyclic or like cyclic structure containing 5 or more carbon atoms. The total carbon atom number of the alicyclic hydrocarbon group (as unsubstituted) is preferably 6 to 30, still preferably 7 to 25. The alicyclic hydrocarbon group may have a substituent. Examples of the alicyclic moiety of the alicyclic hydrocarbon group are shown below.

(1)

(2)

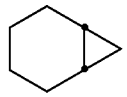

(3)

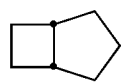

(4)

-continued

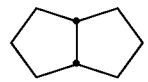

(5)

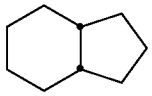

(6)

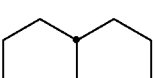

(7)

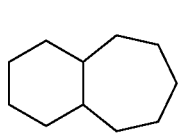

(8)

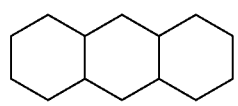

(9)

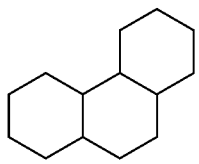

(10)

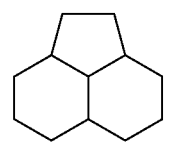

(11)

(12)

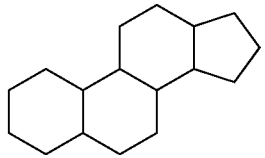

(13)

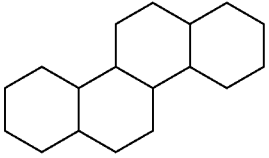

(14)

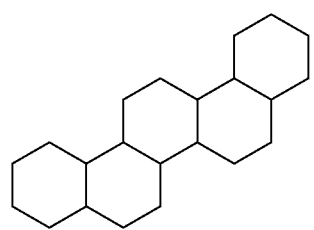

(15)

-continued
(16) 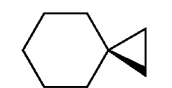
(17) 
(18) 
(19) 
(20) 
(21) 
(22) 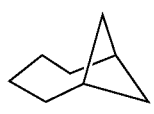
(23) 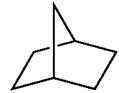
(24) 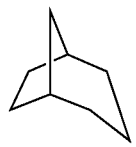
(25) 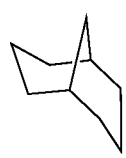
(26) 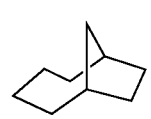
(27) 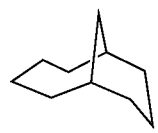
(28) 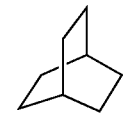
-continued
(29) 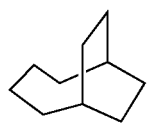
(30) 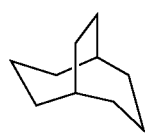
(31) 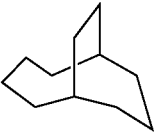
(32) 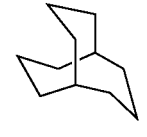
(33) 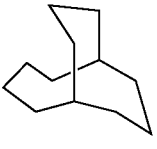
(34) 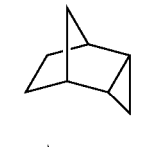
(35) 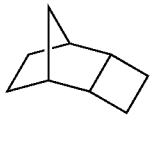
(36) 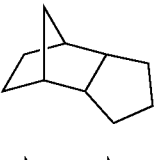
(37) 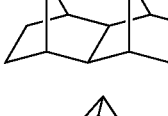
(38) 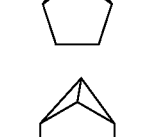
(39) 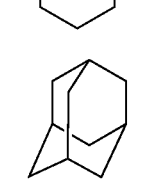
(40)

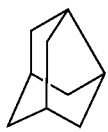 (41)

 (42)

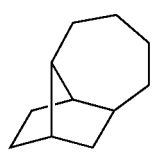 (43)

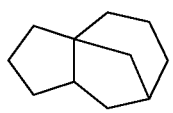 (44)

 (45)

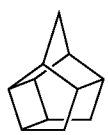 (46)

 (47)

 (48)

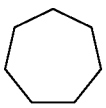 (49)

 (50)

Preferred of these alicyclic moieties are adamantyl, noradamantyl, decalyl, tricyclodecanyl, tetracyclododecanyl, norbornyl, cedryl, cyclohexyl, cycloheptyl, cyclooctyl, cyclodecanyl, and cyclododecanyl. Still preferred are adamantyl, decalyl, norbornyl, cedryl, cyclohexyl, cycloheptyl, cyclooctyl, cyclodecanyl, cyclododecanyl, and tricyclodecanyl.

The substituent the alicyclic hydrocarbon group can have includes an alkyl group, a substituted alkyl group, a halogen atom, a hydroxyl group, an alkoxy group, a carboxyl group, and an alkoxycarbonyl group. The alkyl group is preferably a lower one, e.g., methyl, ethyl, propyl, isopropyl or butyl, still preferably methyl, ethyl, propyl or isopropyl. The substituent of the substituted alkyl group includes a hydroxyl group, a halogen atom, and an alkoxy group. The alkoxy group is preferably one having 1 to 4 carbon atoms, e.g., methoxy, ethoxy, propoxy or butoxy.

Of the repeating units represented by formula (II) those in which $A_2$ is a single bond and ALG is a group represented by formula:

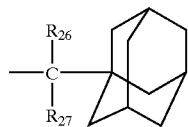

wherein $R_{26}$ and $R_{27}$ each represent a straight-chain or branched alkyl group having 1 to 4 carbon atoms, are particularly preferred for providing a resist pattern with reduced variation of size when observed under a scanning electron microscope (SEM resistance).

Examples of the repeating units represented by formula (II) are shown below.

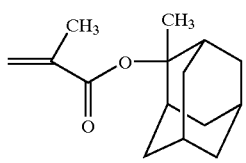

1

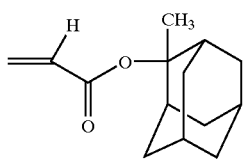

2

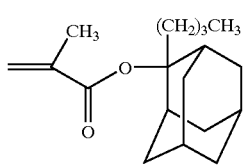

3

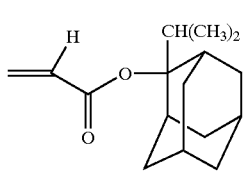

4

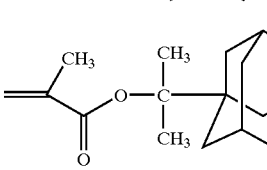

5

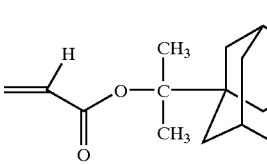

6

-continued
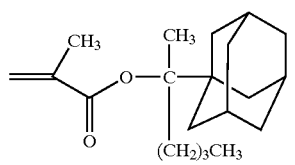
7
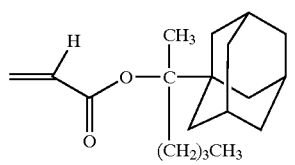
8
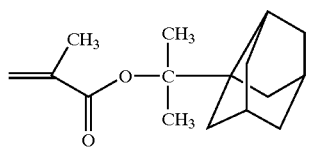
9
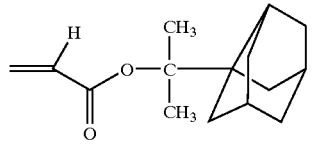
10
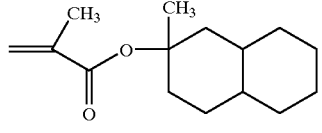
11
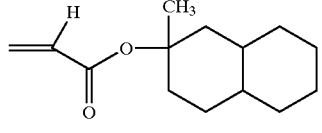
12
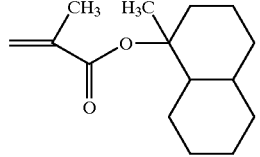
13
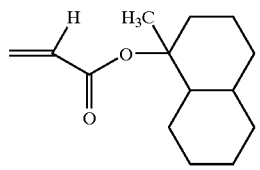
14
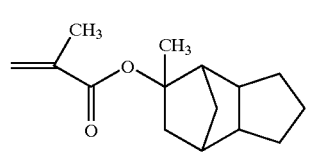
15
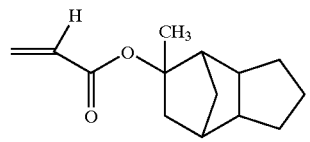
16
-continued
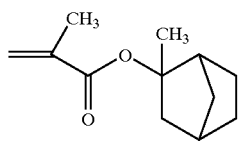
17
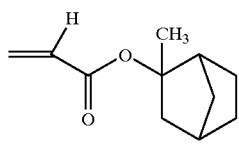
18
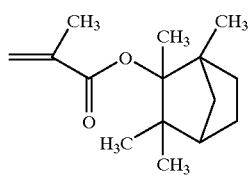
19
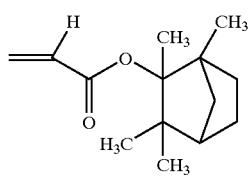
20
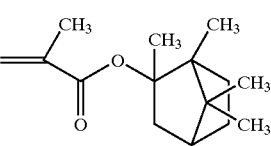
21
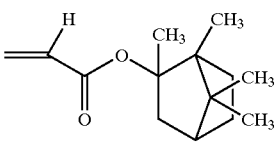
22
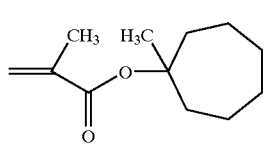
23
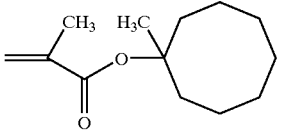
24
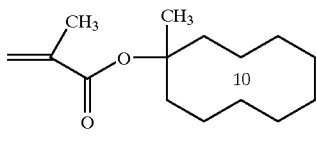
25
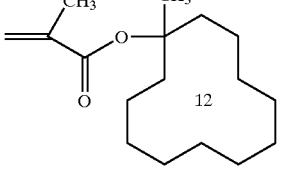
26

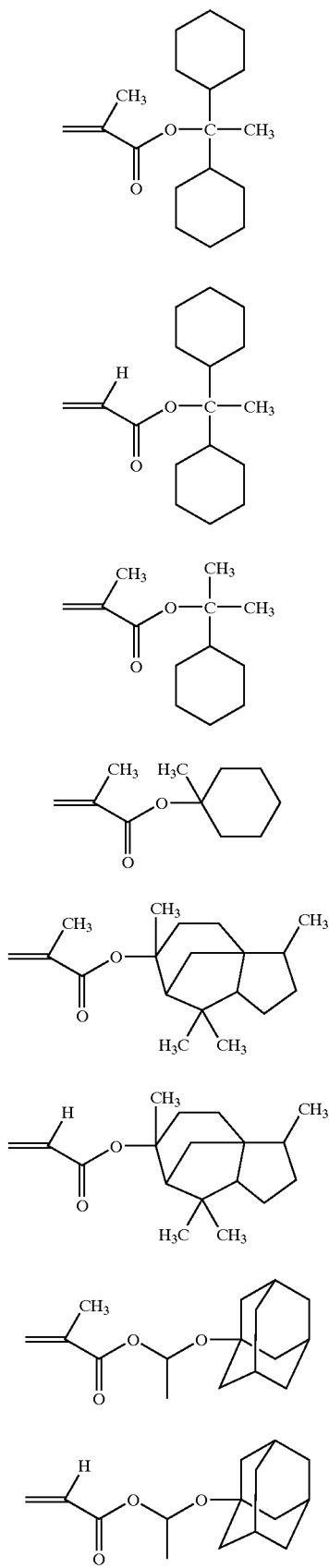

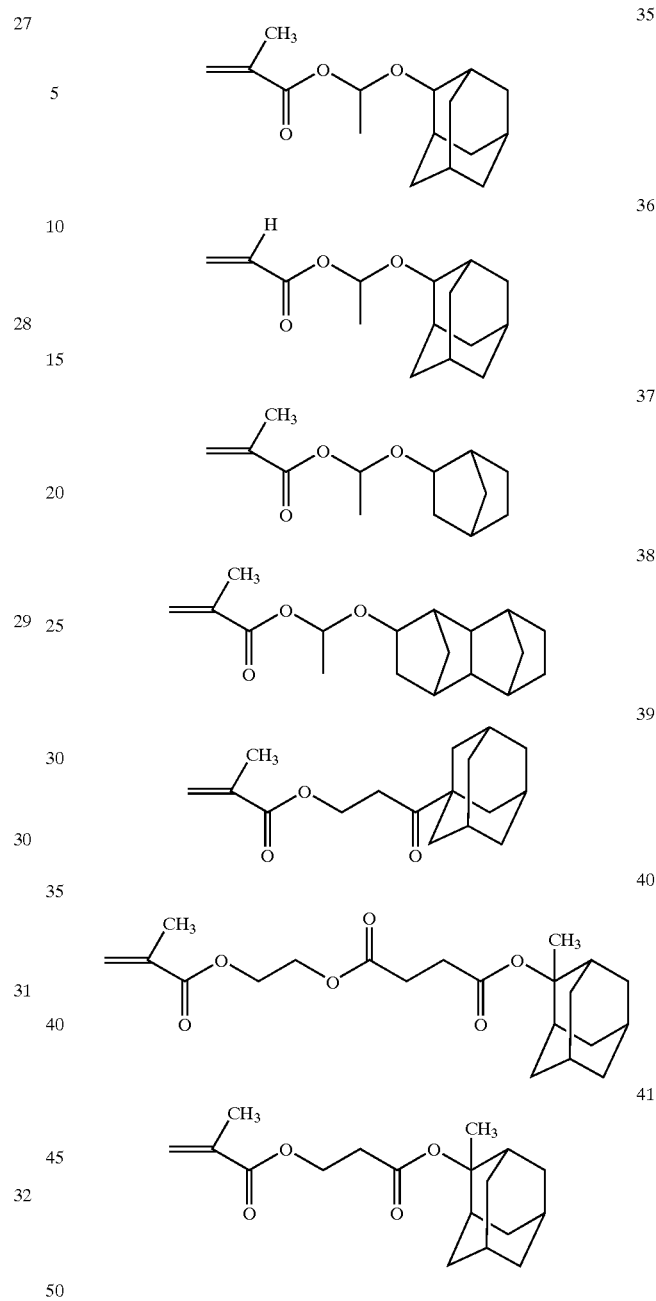

It is preferred that the resin (A) further comprise a repeating unit represented by formula (III):

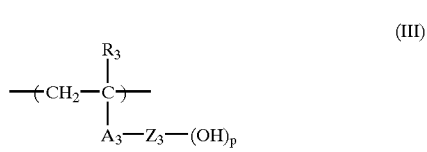

wherein $R_3$ represents a hydrogen atom or a methyl group; $A_3$ represents a single bond or a divalent linking group; $Z_3$ represents an alicyclic hydrocarbon group having a valence of (p+1); and p represents an integer of 1 to 3.

In formula (III), $-Z_3-(OH)_p$ represents an alicyclic hydrocarbon group substituted with p hydroxyl group(s).

The divalent linking group as $A_3$ includes those recited for $A_1$ of formula (I), and the preference as for A applies to $A_3$.

The alicyclic hydrocarbon group as $Z_3$ includes those represented by $R_{12}$ to $R_{25}$ or as formed by Z and the adjacent carbon atom in formula (II), and the same preference applies to $Z_3$.

The p hydroxyl groups may be bonded to any position of the alicyclic hydrocarbon group $Z_3$ (the alicyclic hydrocarbon moiety per se and its substituents if any).

Of the repeating units represented by formula (III), those represented by formula (IIIa) are preferred for improving under-exposure latitude in line pattern formation.

(IIIa)

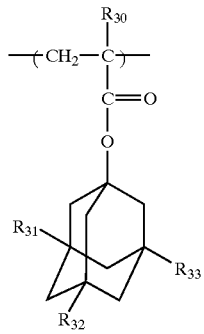

wherein $R_{30}$ represents a hydrogen atom or a methyl group; and $R_{31}$, $R_{32}$, and $R_{33}$ each represent a hydrogen atom, a hydroxyl group or an alkyl group, provided that at least one of $R_{31}$, $R_{32}$, and $R_{33}$ is a hydroxyl group.

To improve under-exposure latitude in hole pattern formation, it is preferred that two of $R_{31}$, $R_{32}$, and $R_{33}$ be hydroxyl groups.

Specific but non-limiting examples of the repeating units represented by formula (III) are shown below.

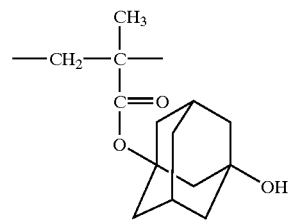 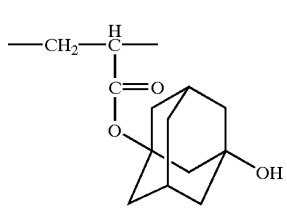

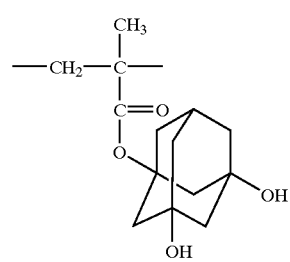 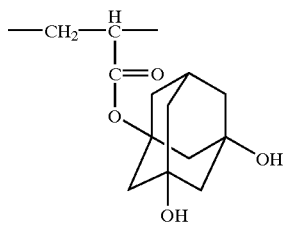

-continued

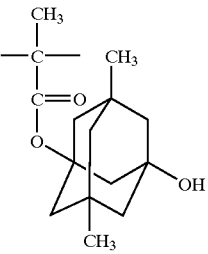 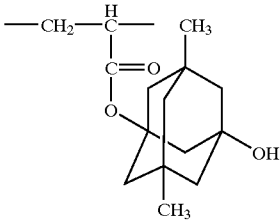

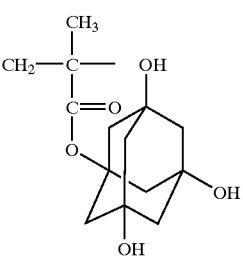 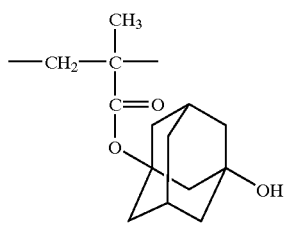

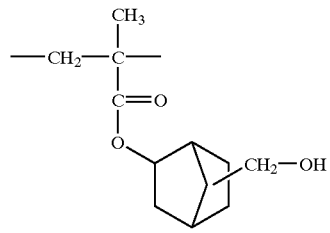

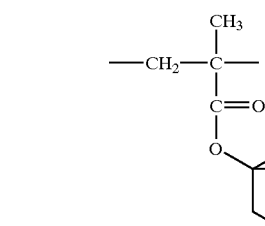

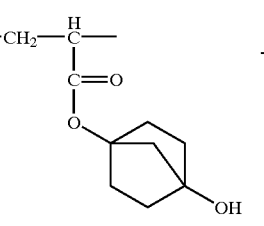 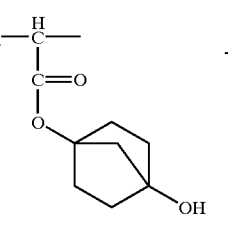 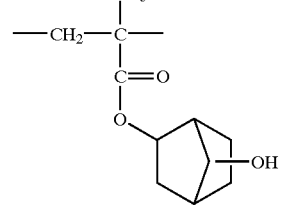

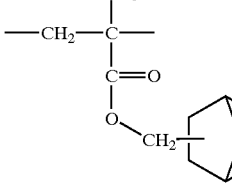 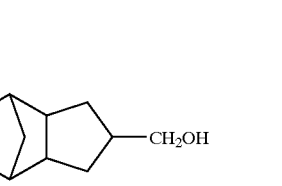

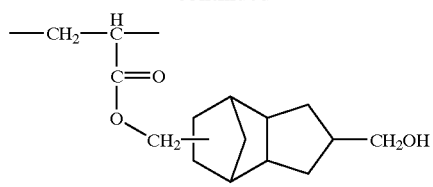
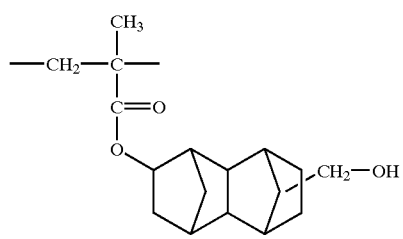
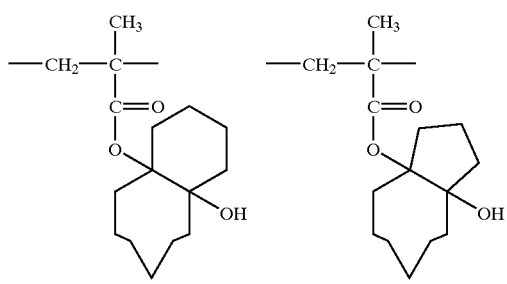
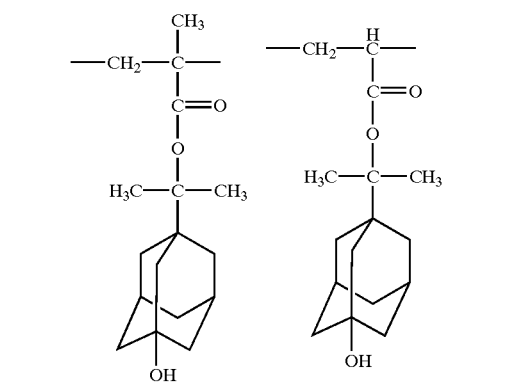
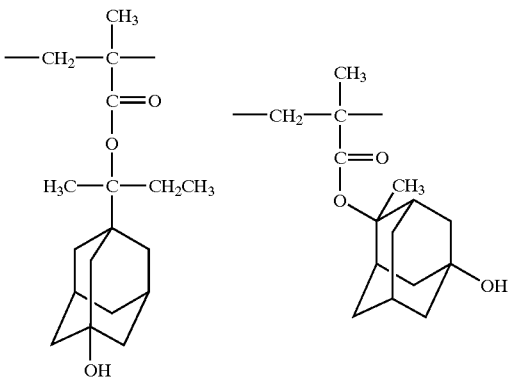

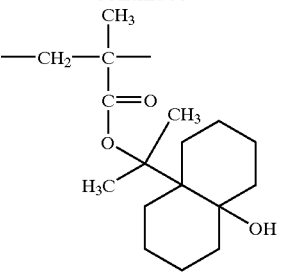

It is preferred for the resin A to comprise a repeating unit having an alicyclic lactone moiety for suppressing hole deformation on etching. Repeating units having an alicyclic lactone moiety include those having a cyclohexane lactone moiety, a norbornane lactone moiety or an adamantane lactone moiety.

Repeating units having a cyclohexane lactone moiety include those having a group represented by formula (V-1) or (V-2). Repeating units having a norbornane lactone moiety include those having a group represented by formula (V-3) or (V-4). Repeating units having an adamantane lactone moiety include those having a group represented by formula (VI).

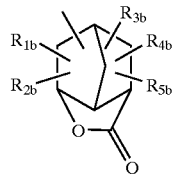

(V-1)

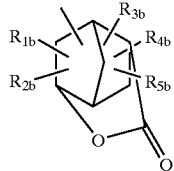

(V-2)

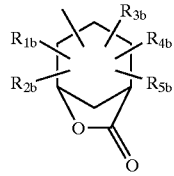

(V-3)

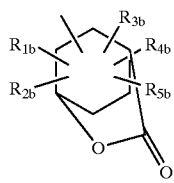

(V-4)

wherein $R_{1b}$, $R_{2b}$, $R_{3b}$, $R_{4b}$, and $R_{5b}$ each represent a hydrogen atom, a substituted or unsubstituted alkyl group, a substituted or unsubstituted cycloalkyl group or a substituted or unsubstituted alkenyl group, and two out of $R_{1b}$, $R_{2b}$, $R_{3b}$, $R_{4b}$, and $R_{5b}$ may be taken together to form a ring.

The alkyl group as $R_{1b}$ to $R_{5b}$ may be straight or branched and substituted or unsubstituted. The alkyl group preferably contains 1 to 12, particularly 1 to 10, carbon atoms. Especially preferred alkyl groups are methyl, ethyl, propyl, isopropyl, n-butyl, isobutyl, sec-butyl, t-butyl, pentyl, hexyl, heptyl, octyl, nonyl, and decyl.

The cycloalkyl group as $R_{1b}$ to $R_{5b}$ is preferably one containing 3 to 8 carbon atoms, such as cyclopropyl, cyclopentyl, cyclohexyl, cycloheptyl or cyclooctyl.

The alkenyl group as $R_{1b}$ to $R_{5b}$ is preferably one containing 2 to 6 carbon atoms, such as vinyl, propenyl, butenyl or hexenyl.

The ring formed of two of $R_{1b}$ through $R_{5b}$ includes a 3- to 8-membered one, such as cyclopropane, cyclobutane, cyclopentane, cyclohexane or cyclooctane.

In formulae (V-1) through (V-4), $R_{1b}$ to $R_{5b}$ are bonded to any carbon atoms making up the cyclic skeleton.

Substituents that the alkyl, cycloalkyl or alkenyl group may have include an alkoxy group containing 1 to 4 carbon atoms, a halogen atom (e.g., fluorine, chlorine, bromine or iodine), an acyl group having 2 to 5 carbon atoms, an acyloxy group having 2 to 5 carbon atoms, a cyano group, a hydroxyl group, a carboxyl group, an alkoxycarbonyl group having 2 to 5 carbon atoms, and a nitro group.

The repeating unit having the group represented by formula (V-1) to (V-4) includes a repeating unit represented by formula (AI):

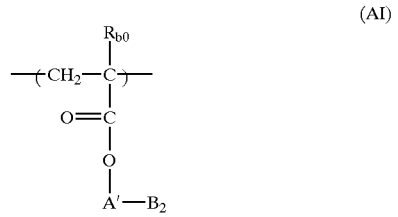
(AI)

wherein $R_{b0}$ represents a hydrogen atom, a halogen atom or a substituted or unsubstituted alkyl group having 1 to 4 carbon atoms; A' represents a single bond or a divalent linking group selected from an ether group, an ester group, a carbonyl group, an alkylene group, and a combination thereof; and $B_2$ represents a lactone group represented by any of formulae (V-1) to (V-4).

Preferred substituents of the substituted alkyl group as $R_{b0}$ include those recited supra as for $R_{1b}$ of formulae (V-1) through (V-4). The halogen atom as $R_{b0}$ includes a fluorine atom, a chlorine atom, a bromine atom, and an iodine atom. $R_{b0}$ is preferably a hydrogen atom. The combination of linking groups as A' includes the following.

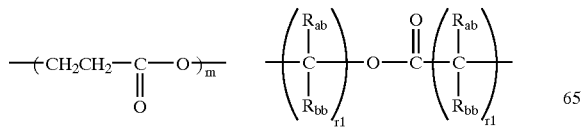

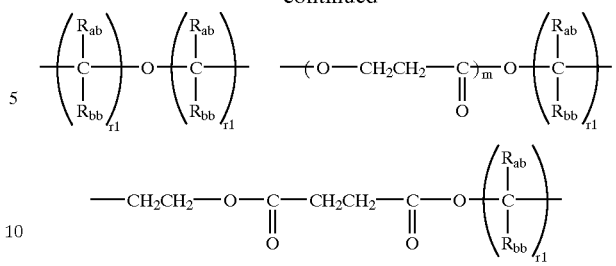

wherein $R_{ab}$ and $R_{bb}$, which may be the same or different, each represent a hydrogen atom, an alkyl group, a substituted alkyl group, a halogen atom, a hydroxyl group or an alkoxy group; m represents an integer of 1 to 3; and r1 represents an integer of 1 to 10.

The alkyl group as $R_{ab}$ or $R_{bb}$ is preferably a lower one, such as methyl, ethyl, propyl, isopropyl or butyl, still preferably methyl, ethyl, propyl or isopropyl. The substituent of the substituted alkyl group includes a hydroxyl group, a halogen atom, and an alkoxy group having 1 to 4 carbon atoms. The alkoxy group as $R_{ab}$ or $R_{bb}$ includes one having 1 to 4 carbon atoms, such as methoxy, ethoxy, propoxy or butoxy. The halogen atom includes chlorine, bromine, fluorine, and iodine. m is preferably 1 or 2. r1 is preferably 1 to 4.

Specific but non-limiting examples of the repeating unit represented by formula (AI) are shown below.

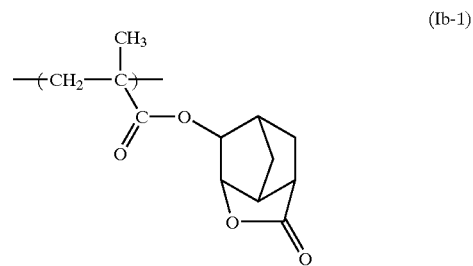
(Ib-1)

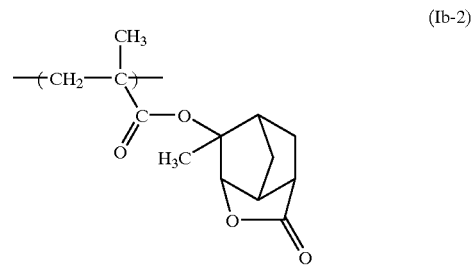
(Ib-2)

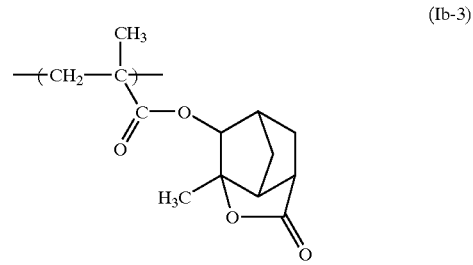
(Ib-3)

(Ib-4)
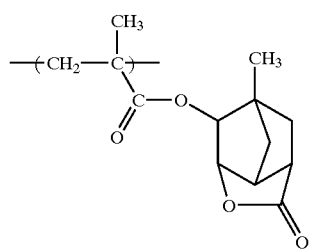
(Ib-5)
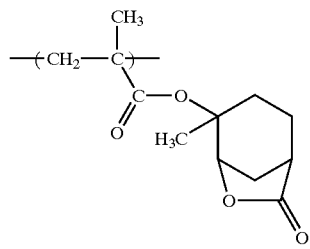
(Ib-6)
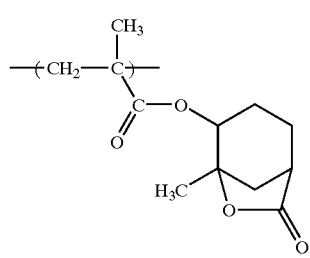
(Ib-7)
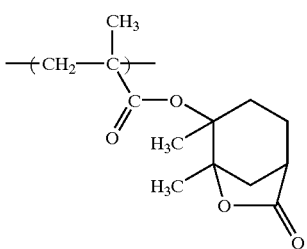
(Ib-8)
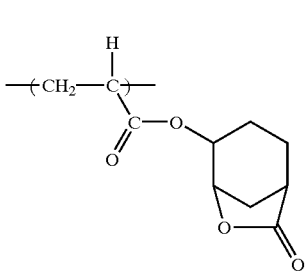
(Ib-9)
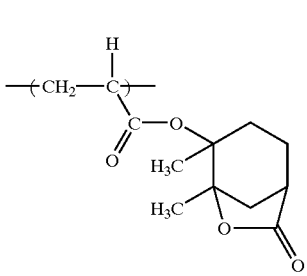
(Ib-10)
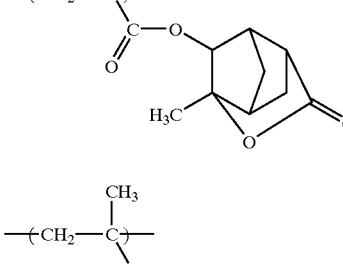
(Ib-11)
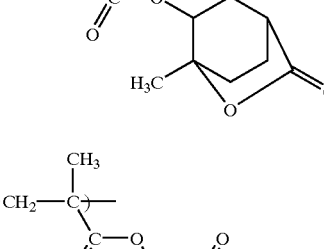
(Ib-12)
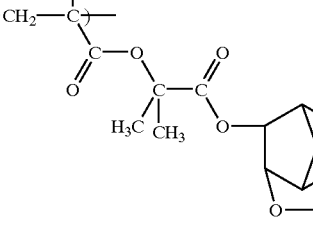
(Ib-13)
(Ib-14)
(Ib-15)

(Ib-16)
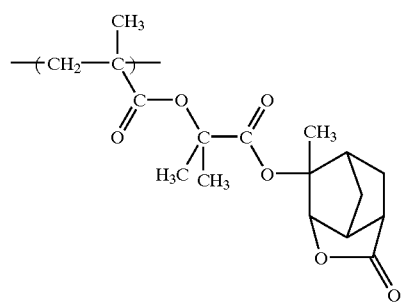
(Ib-17)
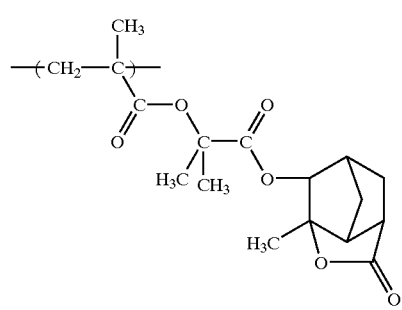
(Ib-18)
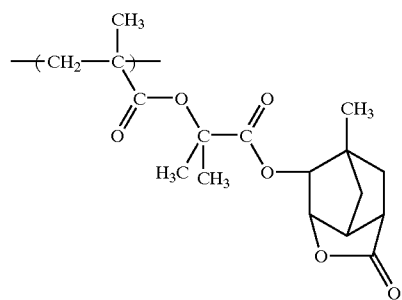
(Ib-19)
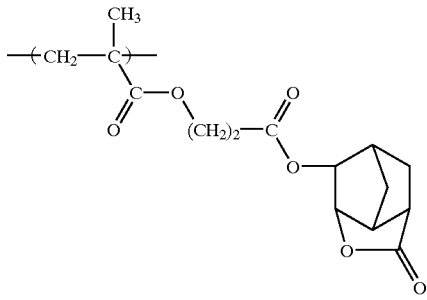
(Ib-20)
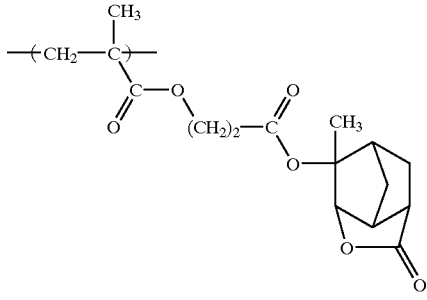
(Ib-21)
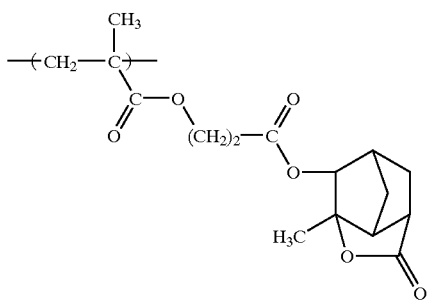
(Ib-22)
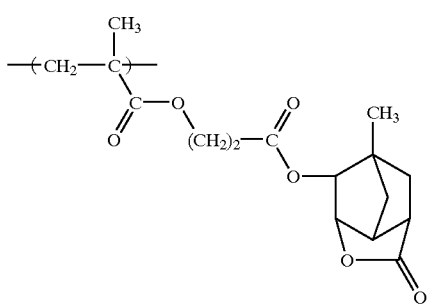
(Ib-23)
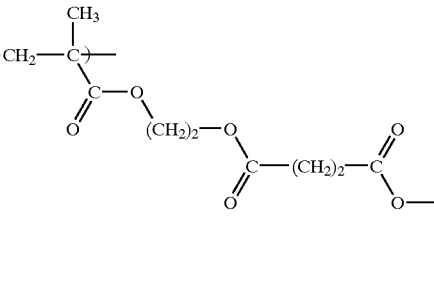
(Ib-24)
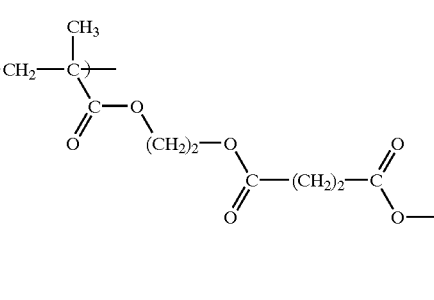

(Ib-25)
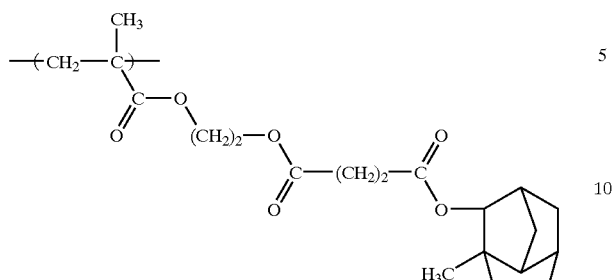
(Ib-26)
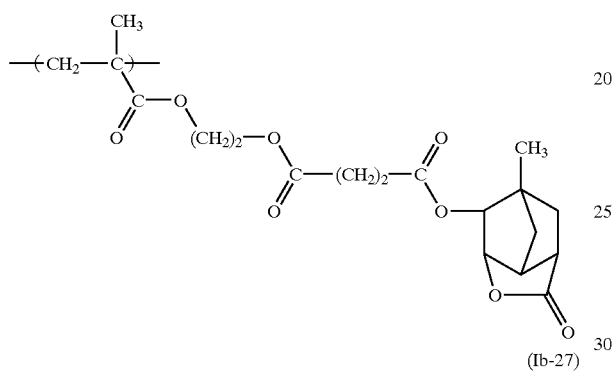
(Ib-27)
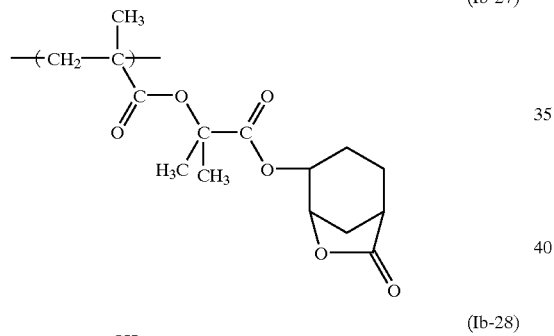
(Ib-28)
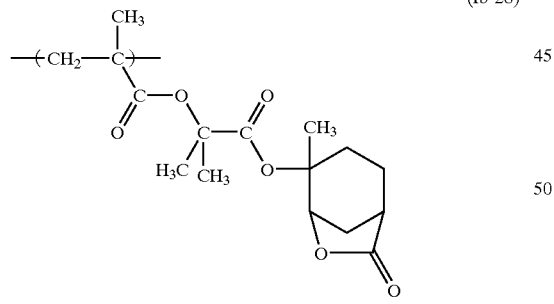
(Ib-29)
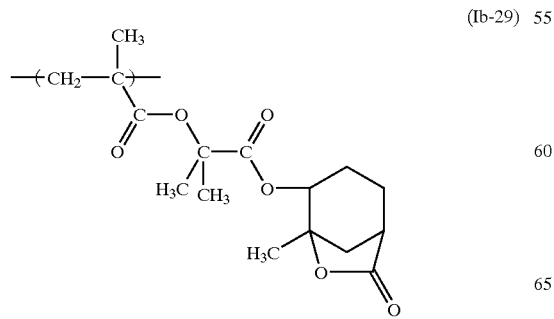
(Ib-30)
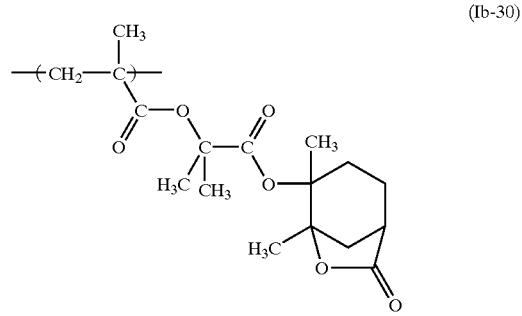
(Ib-31)
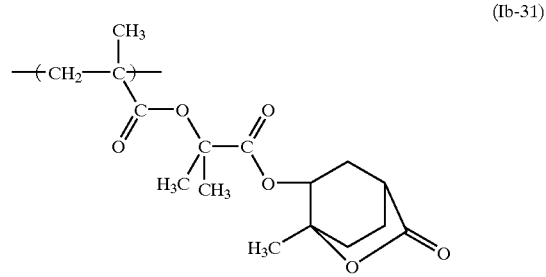
(Ib-32)
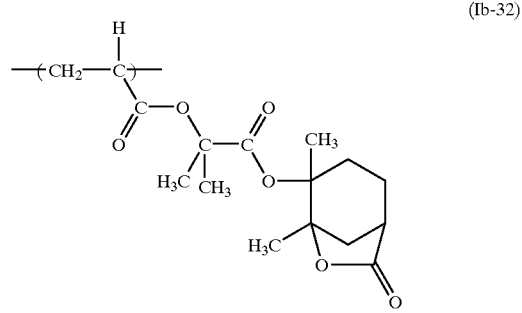
(Ib-33)
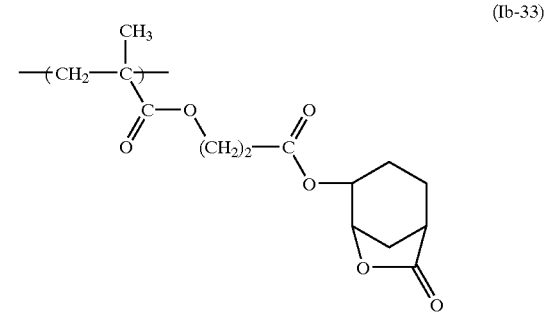
(Ib-34)
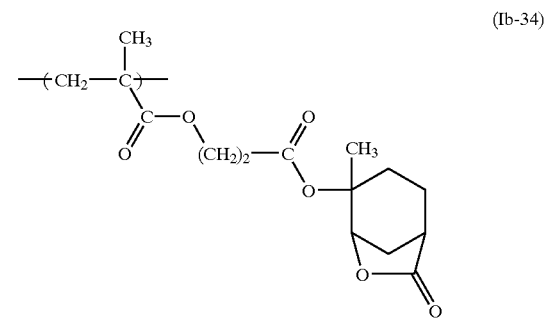

(Ib-35) 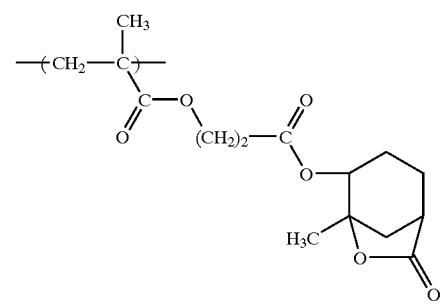
(Ib-36) 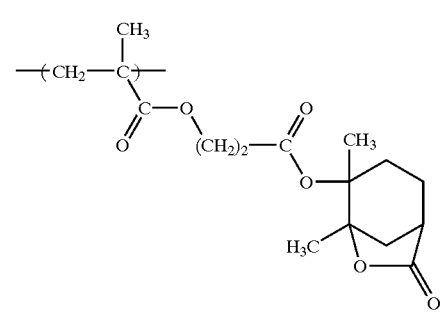
(Ib-37) 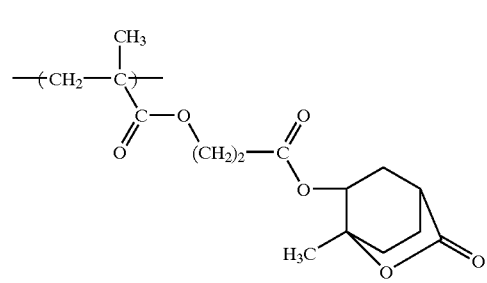
(Ib-38) 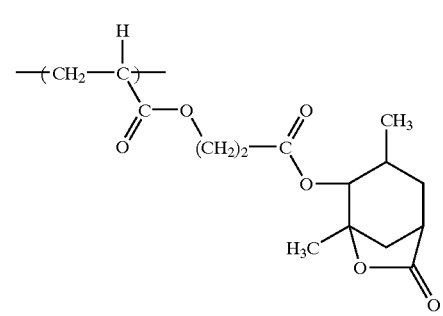
(Ib-39) 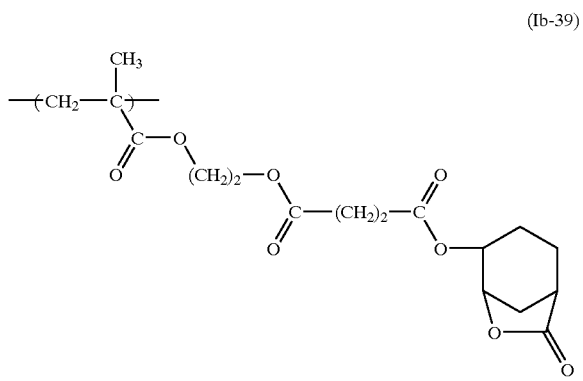
(Ib-40) 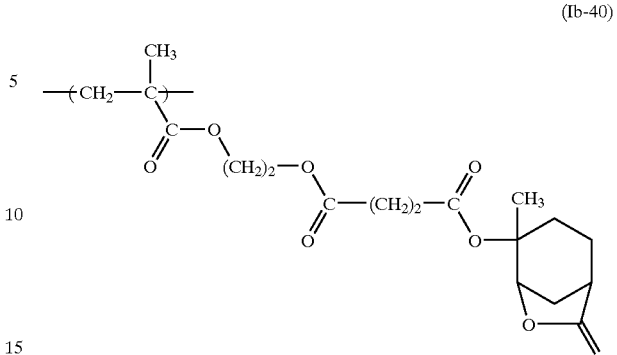
(Ib-41) 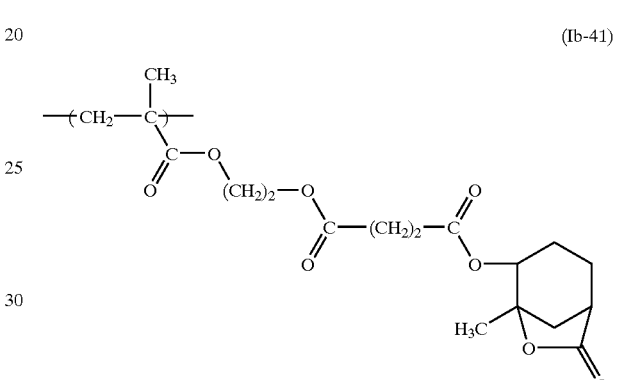
(Ib-42) 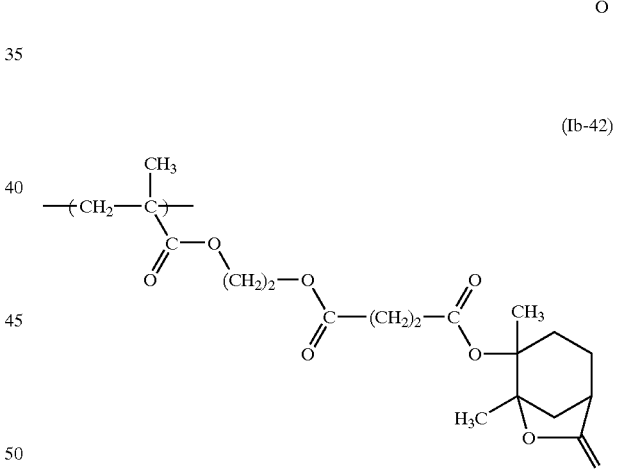
(Ib-43) 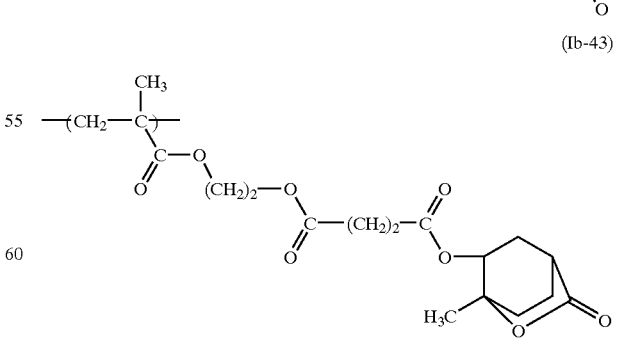

-continued (Ib-44)

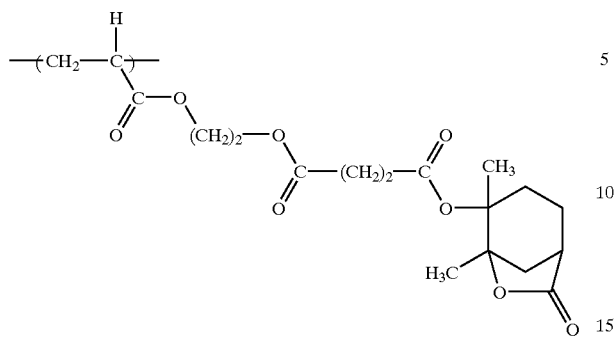

As mentioned supra, the repeating unit having an adamantane lactone moiety includes a repeating unit of formula (VI):

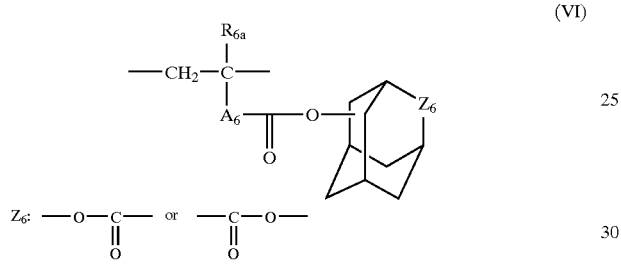

(VI)

wherein $R_{6a}$ represents a hydrogen atom, an alkyl group having 1 to 4 carbon atoms, a cyano group or a halogen atom; $A_6$ represents a single bond or one of, or a combination of two or more of, an alkylene group, a cycloalkylene group, an ether group, a thioether group, a carbonyl group, and an ester group; and $Z_6$ represents —O—C(=O)— or —C(=O)—O—.

In formula (VI), the alkylene group as $A_6$ includes a group represented by formula: —[C($R_{nf}$)($R_{ng}$)]$_r$—, wherein $R_{nf}$ and $R_{ng}$, which may be the same or different, each represent a hydrogen atom, an alkyl group, a substituted alkyl group, a halogen atom, a hydroxyl group or an alkoxy group; and r represents an integer of 1 to 10. The alkyl group in the alkylene group is preferably a lower one, e.g., methyl, ethyl, propyl, isopropyl or butyl, still preferably methyl, ethyl, propyl or isopropyl. The substituent of the substituted alkyl group in the alkylene group includes a hydroxyl group, a halogen atom, and an alkoxy group. The alkoxy group in the alkylene group includes one having 1 to 4 carbon atoms, e.g., methoxy, ethoxy, propoxy or butoxy. The halogen atom in the alkylene group includes chlorine, bromine, fluorine, and iodine.

The cycloalkylene group as $A_6$ includes one having 3 to 10 carbon atoms, such as cyclopentylene, cyclohexylene or cyclooctylene.

The bridged alicyclic ring containing $Z_6$ may have a substituent, such as a halogen atom, an alkoxy group (preferably one having 1 to 4 carbon atoms), an alkoxycarbonyl group (preferably one having 1 to 5 carbon atoms), an acyl group (e.g., formyl or benzoyl), an acyloxy group (e.g., propylcarbonyloxy or benzoyloxy), an alkyl group (preferably one having 1 to 4 carbon atoms), a carboxyl group, a hydroxyl group, and an alkylsulfonylsulfamoyl group (e.g., —CONHSO$_2$CH$_3$). The alkyl group as a substituent may be substituted with a hydroxyl group, a halogen atom, an alkoxy group (preferably one having 1 to 4 carbon atoms), etc.

In formula (VI), the oxygen atom of the ester group linking $A_6$ and the bridged alicyclic ring may be bonded to any carbon atom of the bridged alicyclic ring.

Specific but non-limiting examples of the repeating unit represented by formula (VI) are shown below.

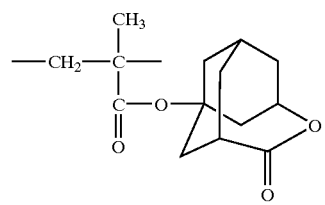

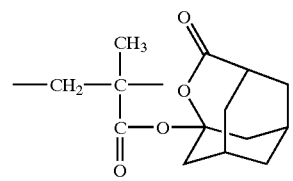

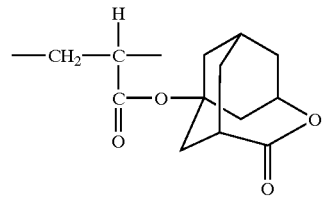

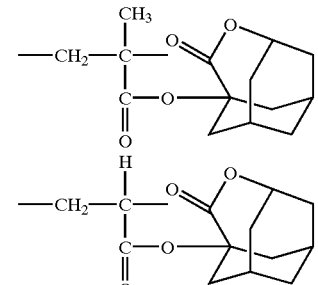

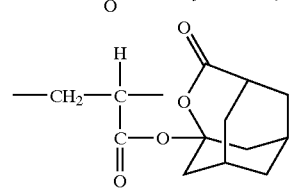

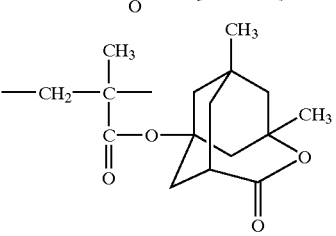

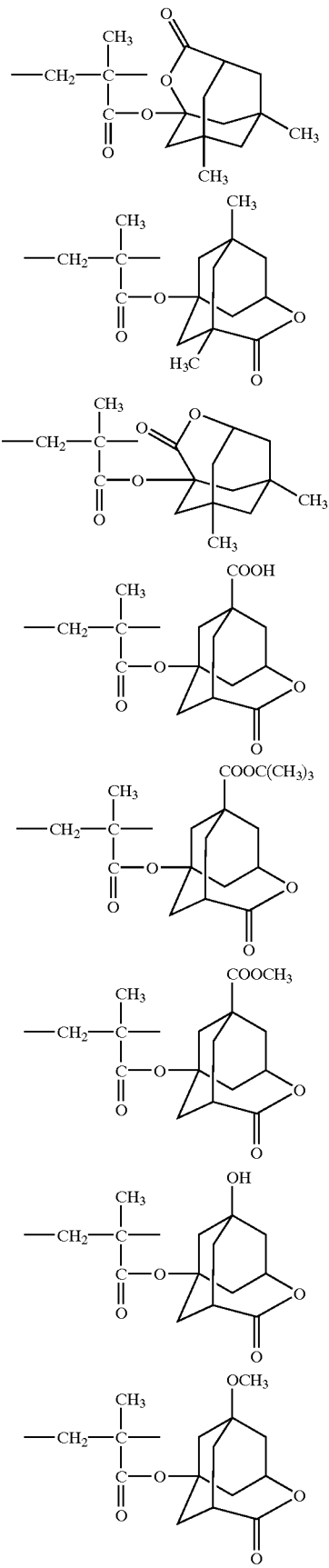

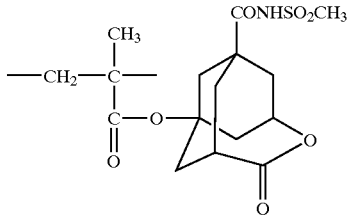

The acid-degradable resin of the invention can further comprise a repeating unit having a lactone moiety and represented by formula (IV):

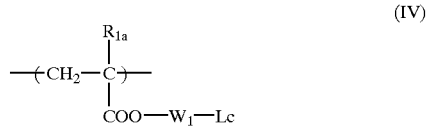

wherein $R_{1a}$ represents a hydrogen atom or a methyl group; $W_1$ represents a single bond or one of, or a combination of two or more of, an alkylene group, an ether group, a thioether group, a carbonyl group, and an ester group; Lc represents a lactone structure of formula:

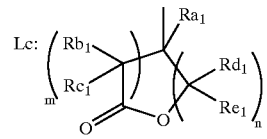

wherein $R_{a1}$, $R_{b1}$, $R_{c1}$, $R_{d1}$, and $R_{e1}$ each represent a hydrogen atom or an alkyl group having 1 to 4 carbon atoms; and m and n each represent an integer of 0 to 3, provided that m+n is 2 to 6.

The $C_{1-4}$ alkyl group as $R_{a1}$ to $R_{e1}$ includes methyl, ethyl, propyl, isopropyl, n-butyl, isobutyl, sec-butyl, and t-butyl.

The alkylene group as $W_1$ includes a group represented by formula: $—[C(R_f)(R_g)]_{r1}—$, wherein $R_f$ and $R_g$, which may be the same or different, each represent a hydrogen atom, an alkyl group, a substituted alkyl group, a halogen atom, a hydroxyl group or an alkoxy group; and r1 represents an integer of 1 to 10. The alkyl group in the alkylene group is preferably a lower one, e.g., methyl, ethyl, propyl, isopropyl or butyl, still preferably methyl, ethyl, propyl or isopropyl. The substituent of the substituted alkyl group in the alkylene group includes a hydroxyl group, a halogen atom, and an alkoxy group. The alkoxy group in the alkylene group includes one having 1 to 4 carbon atoms, e.g., methoxy, ethoxy, propoxy or butoxy. The halogen atom in the alkylene group includes chlorine, bromine, fluorine, and iodine.

Substituents the alkyl group as $R_{a1}$ to $R_{e1}$ can have include a carboxyl group, an acyloxy group, a cyano group, an alkyl group, a substituted alkyl group, a halogen atom, a hydroxyl group, an alkoxy group, a substituted alkoxy group, an acetylamido group, an alkoxycarbonyl group, and an acyl group. The alkyl group as a substituent includes a lower one, such as methyl, ethyl, propyl, isopropyl, butyl, cyclopropyl, cyclobutyl or a cyclopentyl. The substituent of the substituted alkyl group includes a hydroxyl group, a halogen atom, and an alkoxy group. The substituent of the substituted alkoxy group includes an alkoxy group. The alkoxy group includes a lower one having 1 to 4 carbon atoms, such as methoxy, ethoxy, propoxy or butoxy. The acyloxy group includes an acetoxy group. The halogen atom includes chlorine, bromine, fluorine, and iodine.
Specific but non-limiting examples of the repeating units of formula (IV) are shown below.
(IV-1)
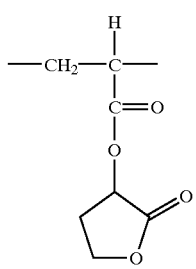
(IV-2)
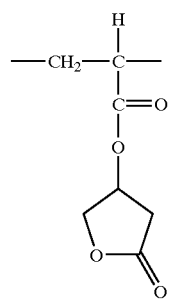
(IV-3)
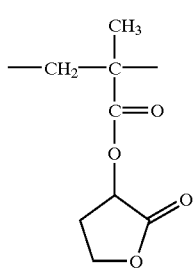
(IV-4)
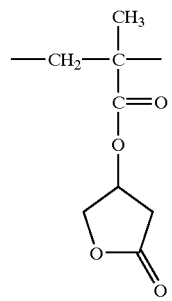
(IV-5)
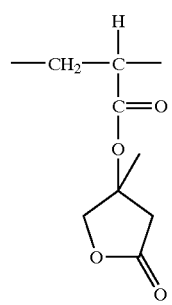
-continued
(IV-6)
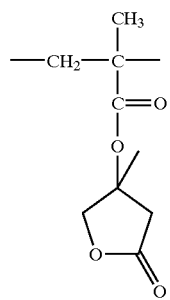
(IV-7)
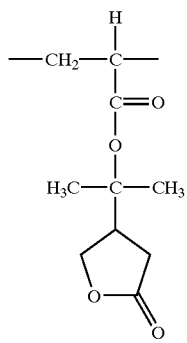
(IV-8)
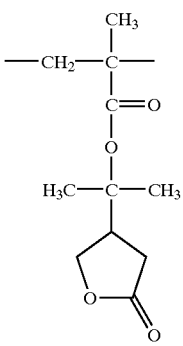
(IV-9)
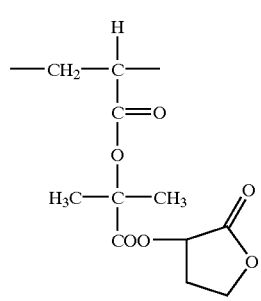
(IV-10)
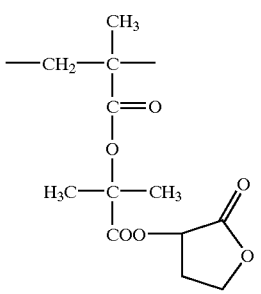

-continued
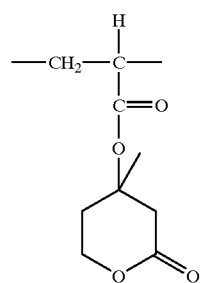
(IV-11)
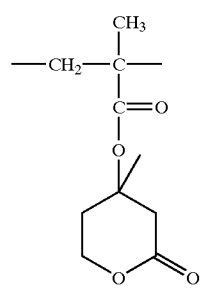
(IV-12)
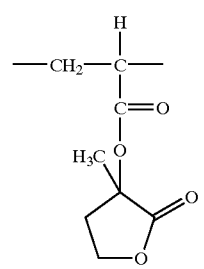
(IV-13)
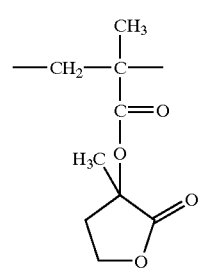
(IV-14)
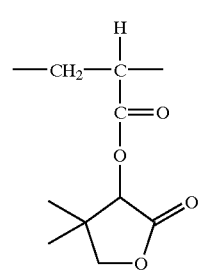
(IV-15)
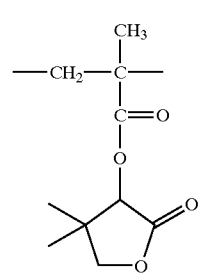
(IV-16)
-continued
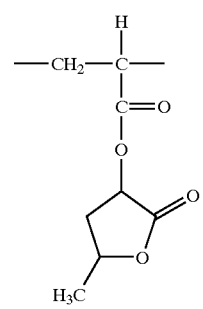
(IV-17)
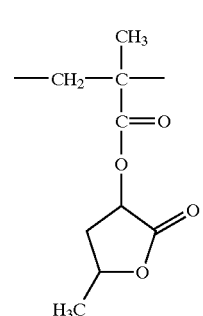
(IV-18)
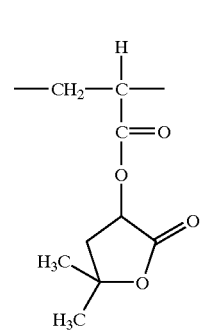
(IV-19)
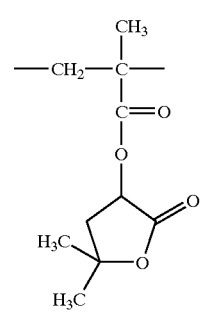
(IV-20)
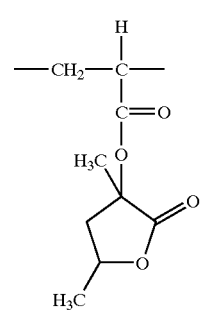
(IV-21)

-continued
(IV-22)
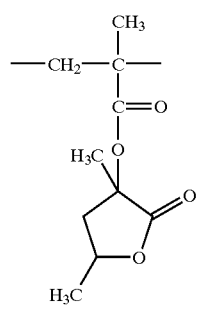
(IV-23)
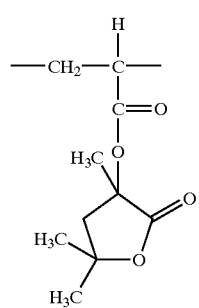
(IV-24)
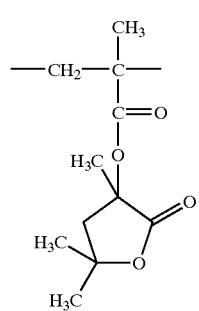
(IV-25)
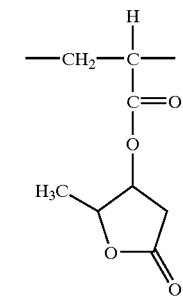
(IV-26)
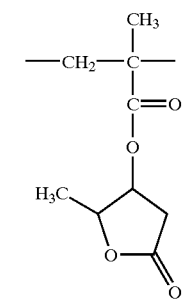
-continued
(IV-27)
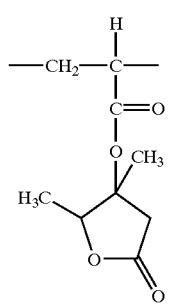
(IV-28)
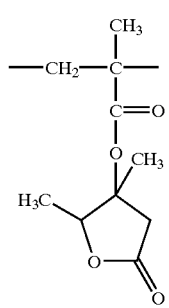
(IV-29)
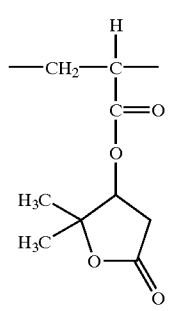
(IV-30)
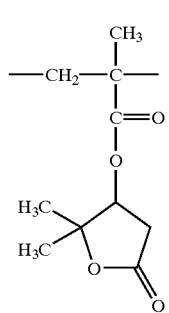
(IV-31)
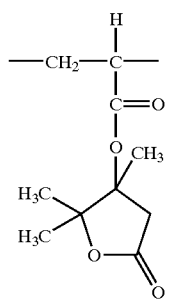

-continued

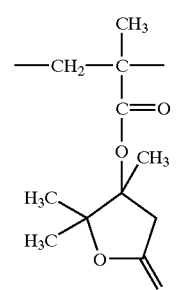
(IV-32)

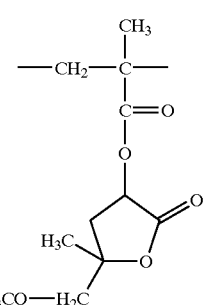
(IV-33)

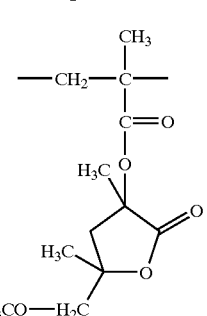
(IV-34)

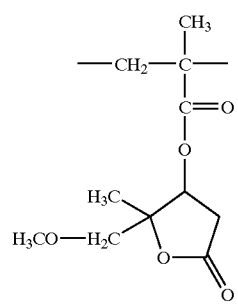
(IV-35)

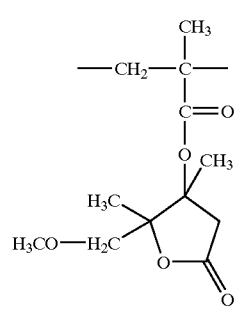
(IV-36)

From the standpoint of a wider exposure latitude, repeating units (IV-17) to (IV-36) are preferred.

The acid-degradable resin (A) may comprise repeating units other than those described above for the purpose of improving dry etching resistance, suitability to standard developing solutions, adhesion to a substrate, resist profile, and basic characteristics required of a resist, such as resolution, heat resistance, and sensitivity. Useful comonomers providing the other repeating units include, but are not limited to, compounds having one addition polymerizable unsaturated bond, such as acrylic esters, methacrylic esters, acrylamides, methacrylamides, allyl compounds, vinyl ethers, and vinyl esters. Incorporation of these repeating units enables fine adjustment of various performance properties required of the acid-degradable resin, particularly solubility in a solvent for coating, film-forming properties (controllable by glass transition point adjustment), alkali developability, resistance to resist film thickness loss (controllable by hydrophilicity or hydrophobicity adjustment and by selection of an alkali soluble group), adhesion (of an unexposed portion) to a substrate, and dry etching resistance.

The acrylic esters include alkyl esters, preferably those having 1 to 10 carbon atoms in the alkyl moiety. Examples are methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate.

The methacrylic esters include alkyl esters, preferably those having 1 to 10 carbon atoms in the alkyl moiety. Examples are methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and
tetrahydrofurfuryl methacrylate.

The acrylamides include acrylamide, N-alkylacrylamides having an alkyl moiety containing 1 to 10 carbon atoms (e.g., methyl, ethyl, propyl, butyl, t-butyl, heptyl, octyl, cyclohexyl or hydroxyethyl), N,N-dialkylacrylamides having an alkyl group containing 1 to 10 carbon atoms (e.g., methyl, ethyl, butyl, isobutyl, ethylhexyl or cyclohexyl), N-hydroxyethyl-N-methylacrylamide, and N-2-acetamidoethyl-N-acetylacrylamide.

The methacrylamides include methacrylamide, N-alkylmethacrylamides having an alkyl moiety containing 1 to 10 carbon atoms (e.g., methyl, ethyl, t-butyl, ethylhexyl, hydroxyethyl or cyclohexyl), N,N-dialkylmethacrylamides having ethyl, propyl, butyl, etc. as an alkyl moiety, and N-hydroxyethyl-N-methylmethacrylamide.

The allyl compounds include allyl esters (e.g., allyl acetate, allyl caproate, allyl caprylate, allyl laurate, allyl palmitate, allyl stearate, allyl benzoate, allyl acetoacetate, and allyl lactate) and allyloxyethanol.

The vinyl ethers include alkyl vinyl ethers, such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether.

The vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexylcarboxylate.

Further included in the other copolymerizable monomers are dialkyl itaconates (e.g., dimethyl itaconate, diethyl itaconate, and dibutyl itaconate), dialkyl fumarates (e.g., dibutyl fumarate), monoalkyl fumarates, crotonic acid, itaconic acid, maleic anhydride, maleimide, acrylonitrile, methacrylonitrile, and maleonitrile. Any other addition polymerizable unsaturated compounds that are copolymerizable with the above-described various repeating units can be used.

The molar ratio of the repeating units constituting the acid-degradable resin (A) is decided appropriately with due consideration for dry etching resistance, suitability to standard developing solutions, adhesion to a substrate, resist profile, and basic characteristics required of a resist, such as resolution, heat resistance, and sensitivity.

More specifically, the content of the repeating unit represented by formula (I) in the resin (A) is preferably 5 to 60 mol %, still preferably 10 to 55 mol %, particularly preferably 15 to 50 mol %. The content of the repeating unit of formula (II) in the resin (A) is preferably 20 to 60 mol %, still preferably 24 to 55 mol %, particularly preferably 28 to 50 mol %. The content of the repeating unit of formula (III) in the resin (A) is preferably 5 to 50 mol %, still preferably 10 to 45 mol %, particularly preferably 15 to 40 mol %.

The content of the repeating unit having an alicyclic lactone moiety in the resin (A) is preferably 5 to 60 mol %, still preferably 10 to 55 mol %, particularly preferably 15 to 50 mol %. The content of the repeating unit having a lactone moiety in the side chain thereof in the resin (A) is preferably 5 to 60 mol %, still preferably 10 to 50 mol %, particularly preferably 15 to 45 mol %.

Where the resist composition of the invention is adapted to be exposed to ArF laser light, it is preferred that the acid-degradable resin (A) be free from an aromatic group to assure transparency to ArF laser light.

The acid-degradable resin (A) is synthesized in a usual manner, for example, by radical polymerization. General radical polymerization is carried out as follows. All the monomers are put into a reaction vessel at once, or some monomers may be added during reaction. If desired, a reaction solvent capable of dissolving the monomer mixture is added to uniformly dissolve the monomer mixture. Useful reaction solvents include ethers, such as tetrahydrofuran, 1,4-dioxane, and diisopropyl ether; ketones, such as methyl ethyl ketone and methyl isobutyl ketone; esters, such as ethyl acetate; and propylene glycol monomethyl ether acetate. A commercially available radical initiator, such as an azo initiator or a peroxide, is added to the system to conduct polymerization of the monomers in an inert gas (e.g., nitrogen or argon) atmosphere under, if necessary, heating. If desired, an additional amount of the initiator can be added later, or the initiator can be added in divided portions. After completion of the reaction, the reaction system is poured into a poor solvent, and the polymer produced is collected in the form of powder or solid. The reaction system concentration is at least 20% by weight, preferably 30% by weight or higher, still preferably 40% by weight or higher. The reaction temperature ranges 10 to 150° C., preferably 30 to 120° C., still preferably 50 to 100° C.

The weight average molecular weight (Mw) of the resin (A) is preferably 3,000 to 100,000, still preferably 4,000 to 50,000, particularly preferably 5,000 to 30,000, in terms of polystyrene equivalent Mw determined by gel-permeation chromatography (GPC). With Mw less than 3,000, the resist tends to have reduced heat resistance or reduced dry etching resistance. With Mw more than 100,000, the resist tends to have reduced developability, or the composition will have too high a viscosity, which can result in poor film-forming properties.

The molecular weight distribution of the resin (A) as represented by Mw/Mn is preferably in a range of 1.3 to 4.0, still preferably 1.4 to 3.8, particularly preferably 1.5 to 3.5.

The resin (A) containing the repeating unit of formula (I) can be used in combination with other resin (A'). The resin (A') includes one containing at least one of the above-recited repeating units other than the repeating unit of formula (I). A weight ratio of the resin (A) to the resin (A') is generally 99/1 to 10/90, preferably 95/5 to 20/80, still preferably 90/10 to 30/70. In view of compatibility, it is desirable that at least one of the repeating units making up the resin (A') be the same as a repeating unit (except the unit of formula (I)) of the resin (A). The weight average molecular weight, the molecular weight distribution, and the preference therefor described with respect to the resin (A) apply to the resin (A').

The total resin content in the positive resist composition of the invention preferably ranges from 40 to 99.99% by weight, particularly 50 to 99.97% by weight, on a solid basis.

The compound which can be used in the invention as component (B) is a photo-acid generator which is capable of generating an acid on exposure to active light rays or a radiation. The photo-acid generator to be used is appropriately selected from compounds capable of generating an acid on exposure to known light sources (e.g., ultraviolet rays of 200 to 400 nm, far ultraviolet rays, especially g-lines, h-lines, i-lines, and KrF excimer laser light), ArF excimer laser light, electron beams, X-rays, molecular beams or ion beams, which are used as photo initiators for photo-cationic polymerization, photo initiators for photo-radical polymerization, photobleaching agents for dyes, photo-discoloring agents, compounds used in microresists, and the like. These compounds can be used either individually or as a mixture thereof.

Further included in useful photo-acid generators are onium salts, such as diazonium salts, ammonium salts, phosphonium salts, iodonium salts, sulfonium salts, selenonium salts, and arsonium salts; organic halogen compounds; organometallic/organohalogen compounds; photo-acid generators having an o-nitrobenzyl type protective group; compounds generating sulfonic acid on photolysis which are represented by iminosulfonates; disulfone compounds; diazoketosulfone compounds; and diazodisulfone compounds.

Polymers having the photo-acid generating compound recited above or a photo-acid-generating group derived there from in the main or side chain thereof are also useful as component (B).

Additional useful photo-acid generators are described in V. N. R. Pillai, *Synthesis*, 1, (1980), 1, A. Abad, et al., *Tetrahedron Lett.*, 47, (1971), 4555, D. H. R. Barton, et al., *J. Chem. Soc.*, (C), 1970, 329, U.S. Pat. No. 3,779,778, and EP126,712.

Of the above-recited acid generators, the following four groups -of compounds are particularly effective.

(B1) Oxazole derivatives represented by formula (PAG1) and s-triazine derivatives represented by formula (PAG2), both having a trihalomethyl group.

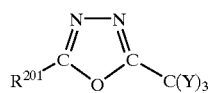
(PAG1)

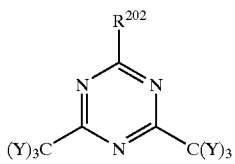
(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or $-C(Y)_3$; and Y represents a chlorine atom or a bromine atom.

Illustrative examples of the group (B1) compounds are shown below.

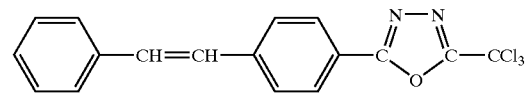
(PAG1-1), (PAG1-2), (PAG1-3), (PAG1-4), (PAG1-5)

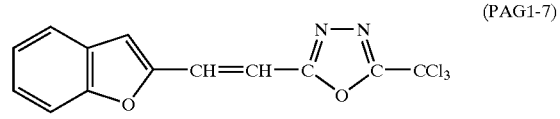
(PAG1-6)

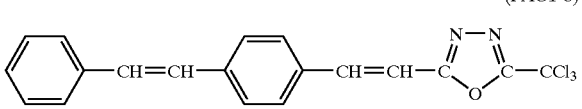
(PAG1-7)

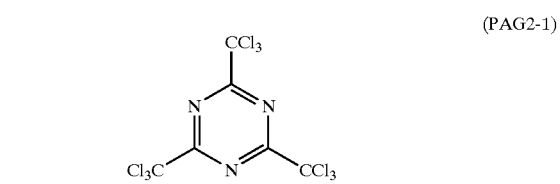
(PAG1-8)

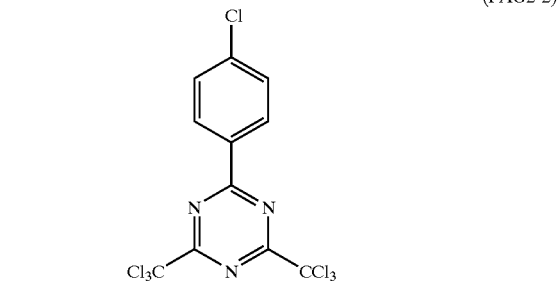
(PAG2-1), (PAG2-2)

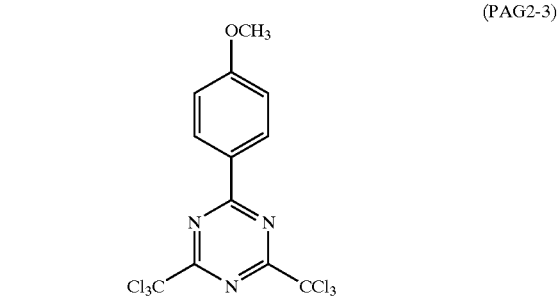
(PAG2-3)

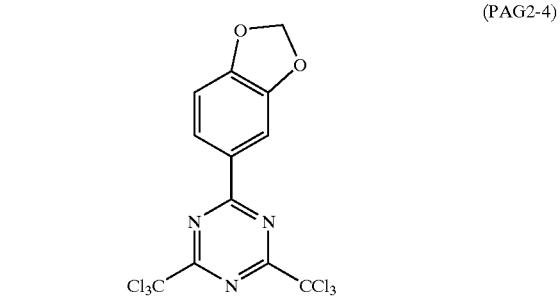
(PAG2-4)

-continued (PAG2-5)

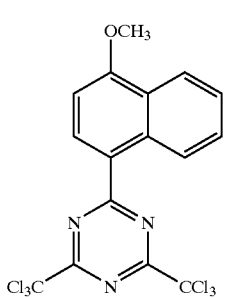

(PAG2-6)

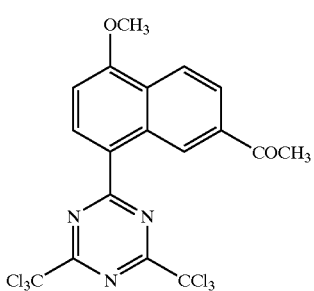

(PAG2-7)

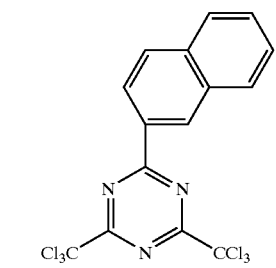

(PAG2-8)

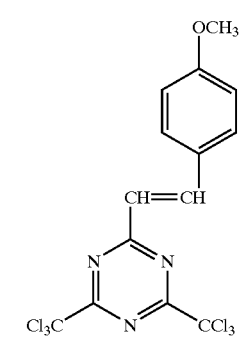

(PAG2-9)

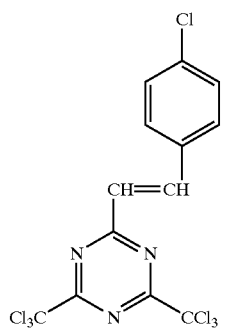

-continued (PAG2-10)

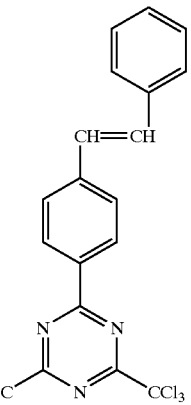

(B2) Iodonium salts represented by formula (PAG3) and sulfonium salts represented by formula (PAG4):

(PAG3)

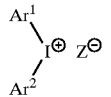

(PAG4)

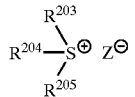

wherein $Ar^1$ and $Ar^2$ each represent a substituted or unsubstituted aryl group; $Ar^1$ and $Ar^2$ may be connected via a single bond or a substituent; $R^{203}$, $R^{204}$, and $R^{205}$ each represent a substituted or unsubstituted alkyl group or a substituted or unsubstituted aryl group; two out of $R^{203}$, $R^{204}$, and $R^{205}$ may be connected via a single bond or a substituent; and $Z^-$ represents a counter anion.

The counter anion $Z^-$ includes, but is not limited to, $BF_4^-$, $AsF_6^-$, $PF_6^-$, $SbF_6^-$, $SiF_6^{2-}$, $ClO_4^-$, perfluoroalkanesulfonate anions (e.g., $CF_3SO_3^-$), aromatic sulfonate anions (e.g., pentafluorobenzenesulfonate anion), condensed polynucleic aromatic sulfonate anions (e.g., naphthalene-1-sulfonate anion), an anthraquinonesulfonate anion, and sulfonic group-containing dye anions.

Illustrative examples of the group (B2) compounds are shown below. In the formulae given, $^tBu$ stands for a t-butyl group, and Ph stands for a phenyl group.

(PAG3-1)

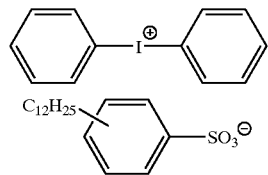

(PAG3-2)
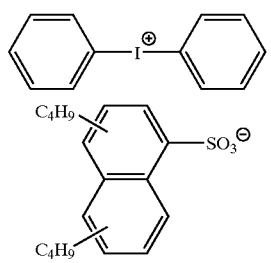
(PAG3-3)
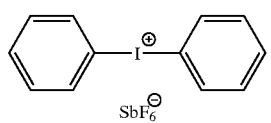
(PAG3-4)
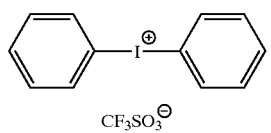
(PAG3-5)
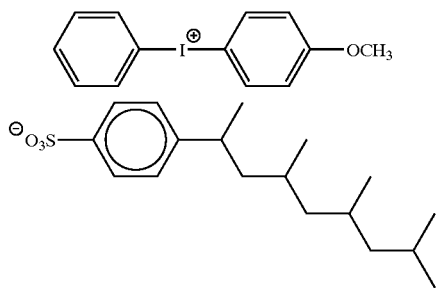
(PAG3-6)
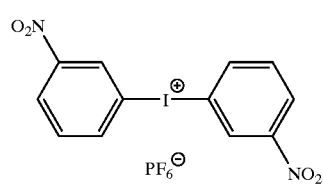
(PAG3-7)
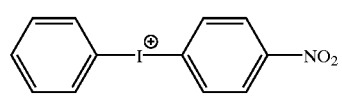
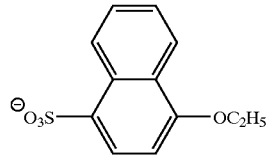
(PAG3-8)
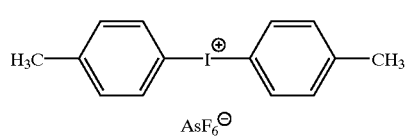
(PAG3-9)
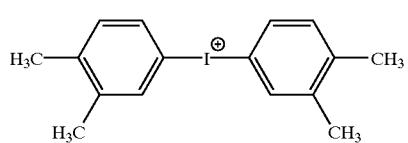
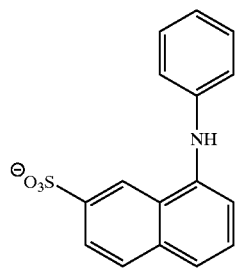
(PAG3-10)
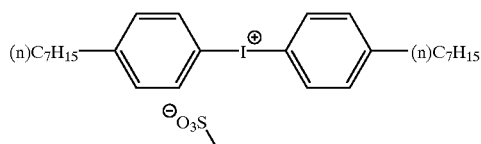
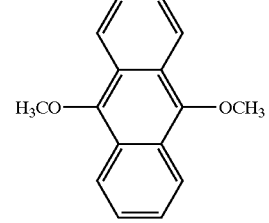
(PAG3-11)
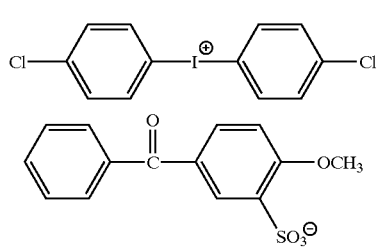
(PAG3-12)
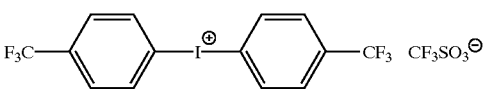
(PAG3-13)
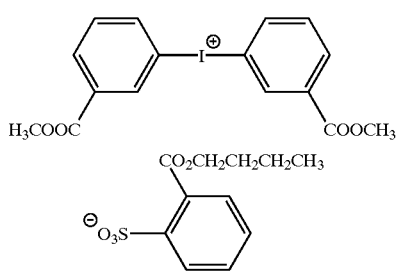

(PAG3-14)
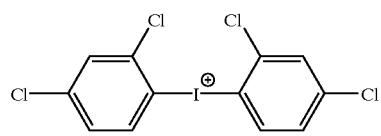
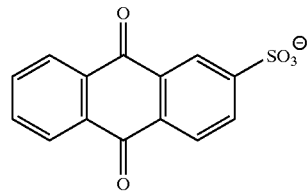
(PAG3-15)
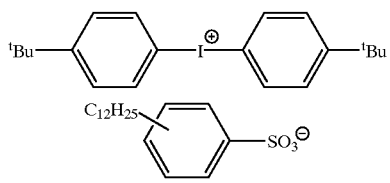
(PAG3-16)
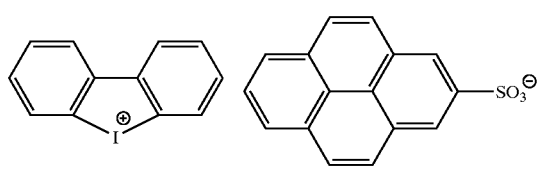
(PAG3-17)
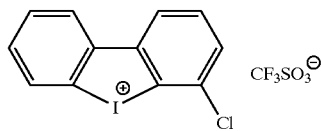
(PAG3-18)
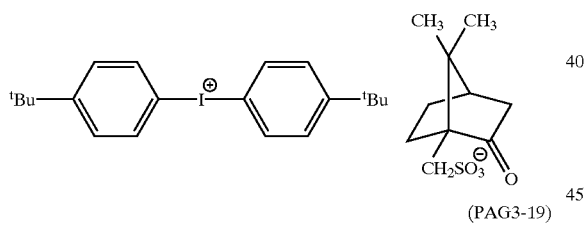
(PAG3-19)
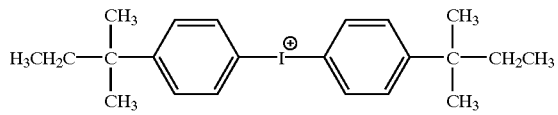
(PAG3-20)
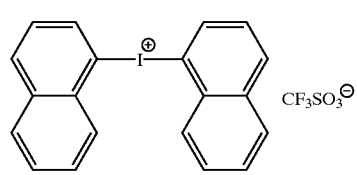
(PAG3-21)
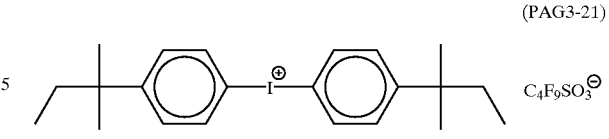
(PAG3-22)
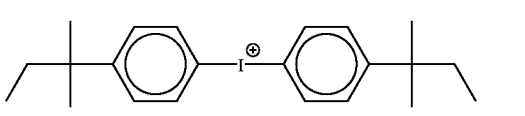
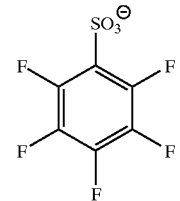
(PAG3-23)
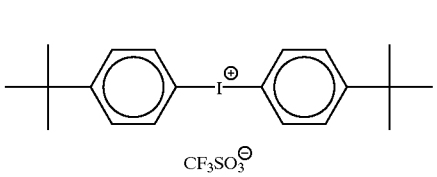
(PAG3-24)
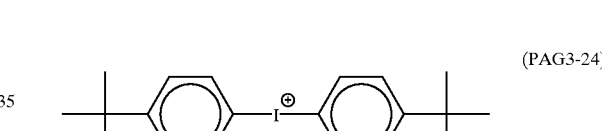
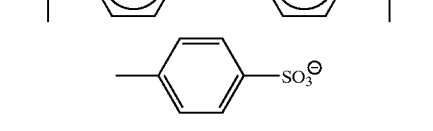
(PAG3-25)
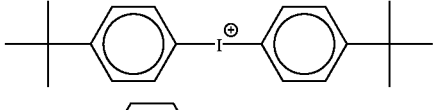
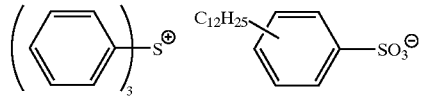
(PAG4-1)
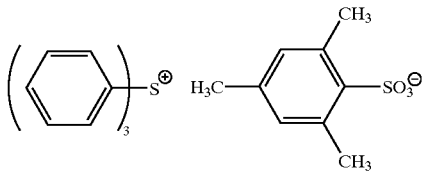
(PAG4-2)
(PAG4-3)
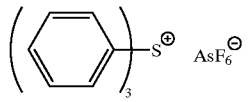

(PAG4-4) 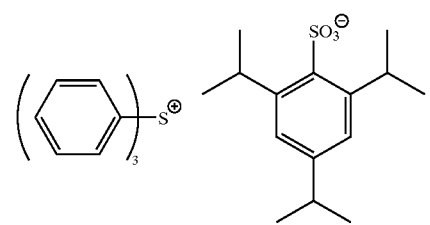
(PAG4-5) 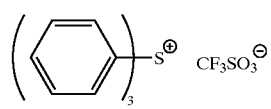
(PAG4-6) 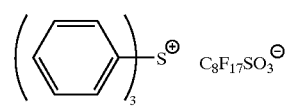
(PAG4-7) 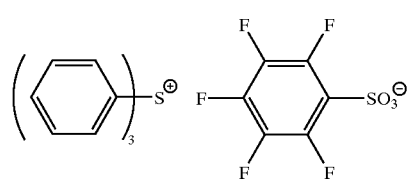
(PAG4-8) 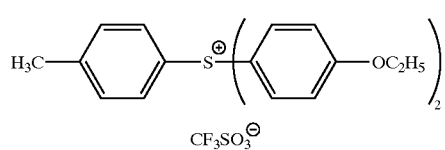
(PAG4-9) 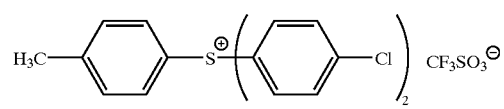
(PAG4-10) 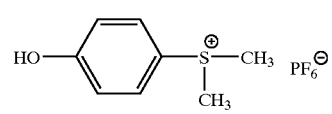
(PAG4-11) 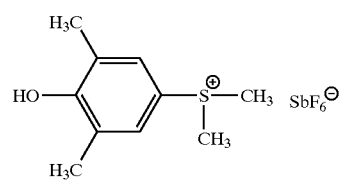
(PAG4-12) 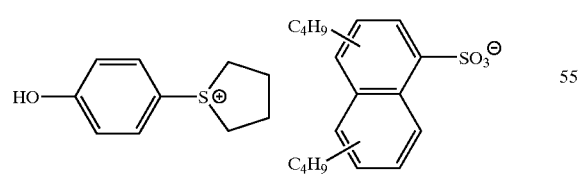
(PAG4-13) 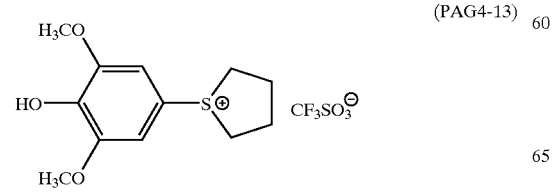
(PAG4-14) 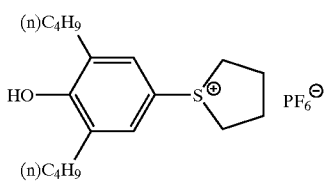
(PAG4-15) 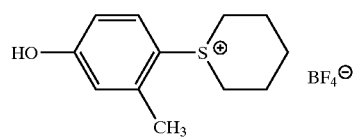
(PAG4-16) 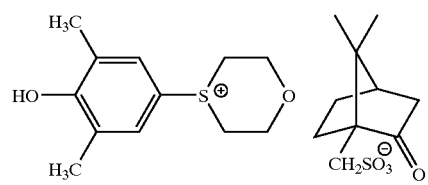
(PAG4-17) 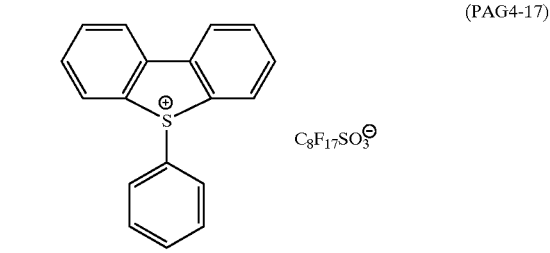
(PAG4-18) 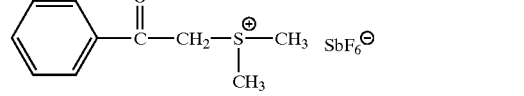
(PAG4-19) 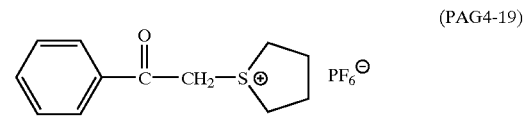
(PAG4-20) 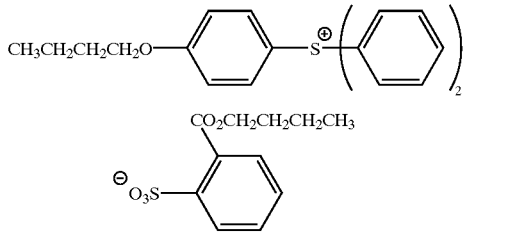
(PAG4-21) 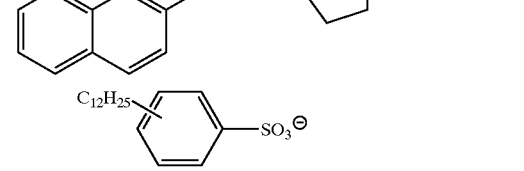
(PAG4-22)  

-continued (PAG4-23), (PAG4-24), (PAG4-25), (PAG4-26), (PAG4-27), (PAG4-28), (PAG4-29), (PAG4-30), (PAG4-31), (PAG4-32), (PAG4-33), (PAG4-34), (PAG4-35), (PAG4-36)

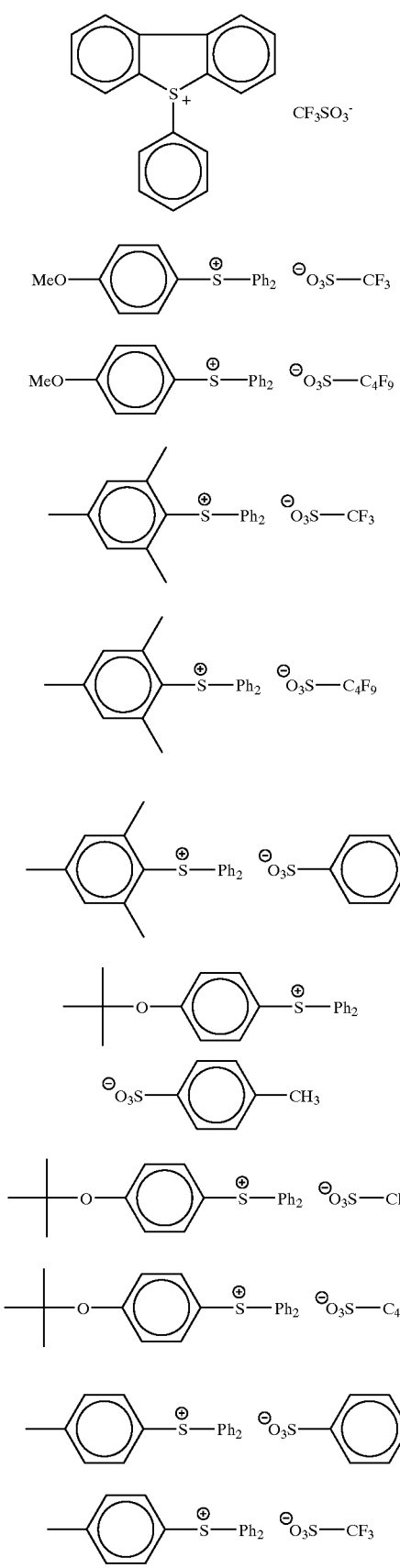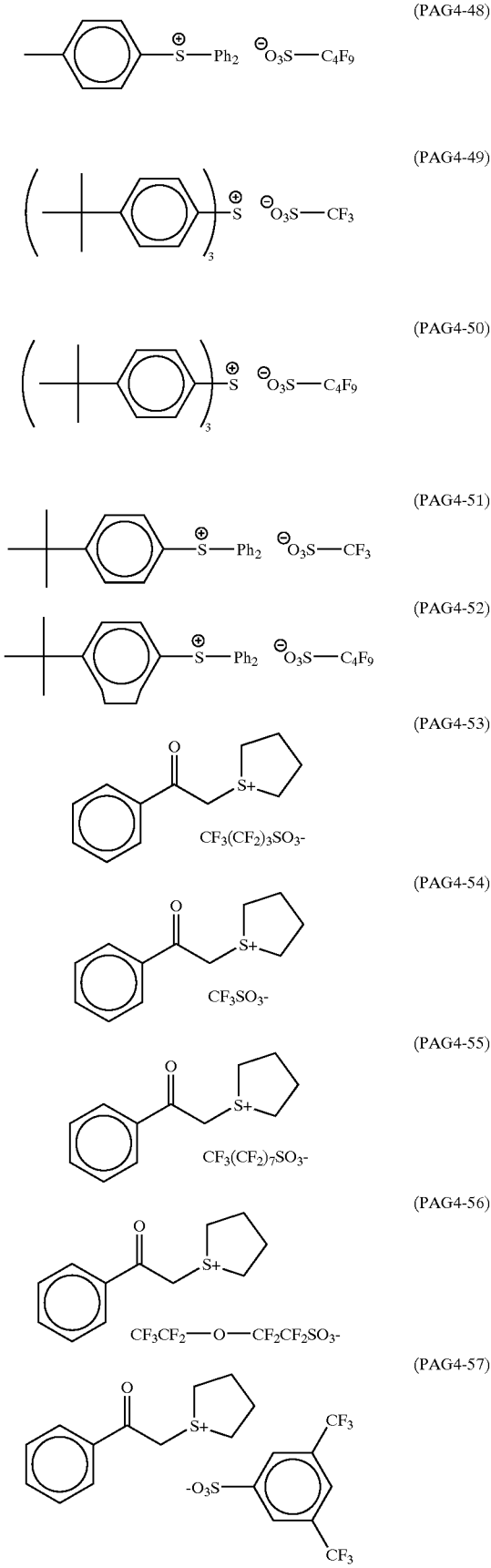

(PAG4-58)
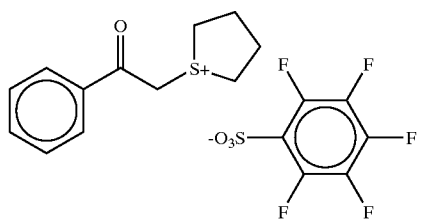
(PAG4-59)
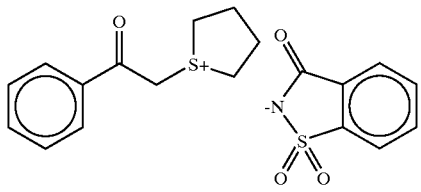
(PAG4-60)
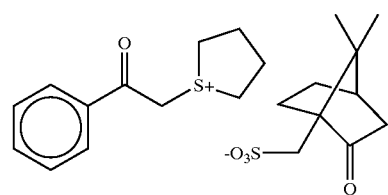
(PAG4-61)
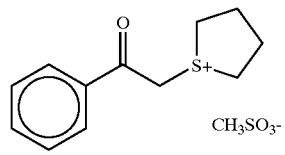
CH₃SO₃-
(PAG4-62)
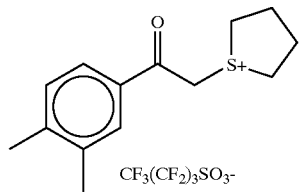
CF₃(CF₂)₃SO₃-
(PAG4-63)
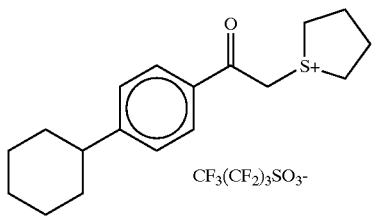
CF₃(CF₂)₃SO₃-
(PAG4-64)
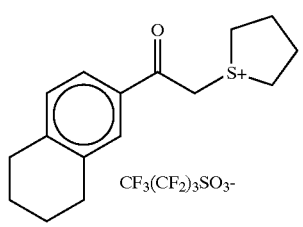
CF₃(CF₂)₃SO₃-
(PAG4-65)
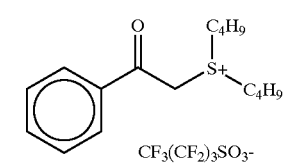
CF₃(CF₂)₃SO₃-
(PAG4-66)
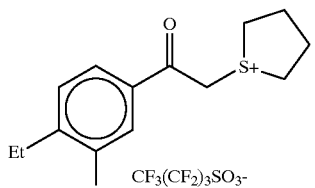
CF₃(CF₂)₃SO₃-
(PAG4-67)
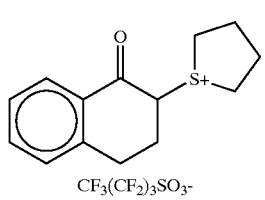
CF₃(CF₂)₃SO₃-
(PAG4-68)
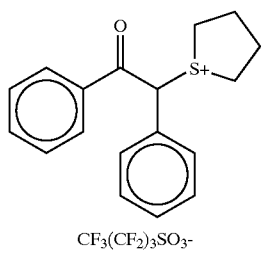
CF₃(CF₂)₃SO₃-
(PAG4-69)
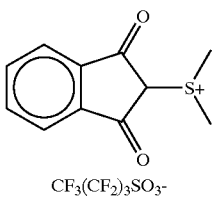
CF₃(CF₂)₃SO₃-
(PAG4-70)
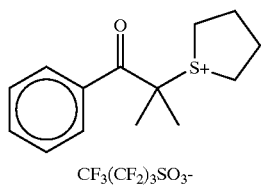
CF₃(CF₂)₃SO₃-
(PAG4-71)
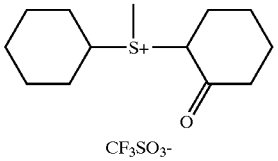
CF₃SO₃-
(PAG4-72)
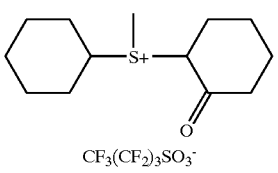
CF₃(CF₂)₃SO₃-
(PAG4-73)
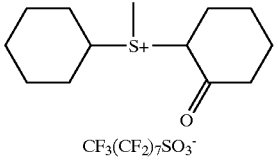
CF₃(CF₂)₇SO₃-

(PAG4-74)
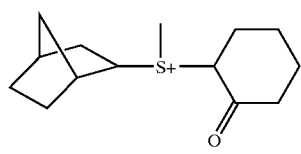
(PAG4-75)
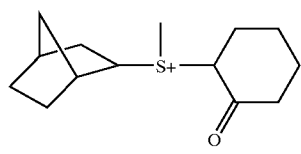
(PAG4-76)
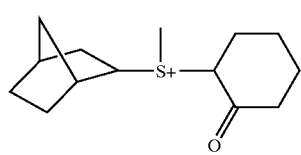
(PAG4-77)
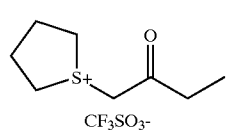
(PAG4-78)
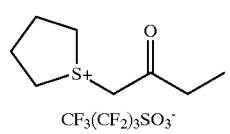
(PAG4-79)
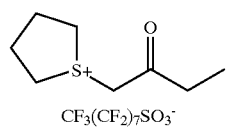
(PAG4-80)
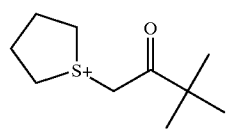
(PAG4-81)
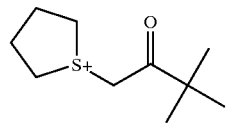
(PAG4-82)
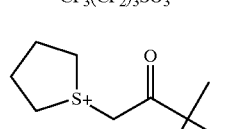
(PAG4-83)
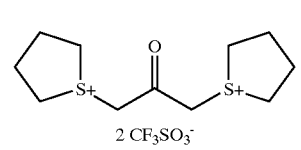
(PAG4-84)
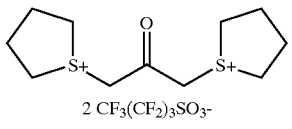
(PAG4-85)
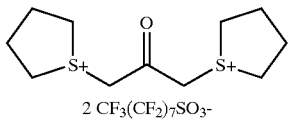
(PAG4-86)
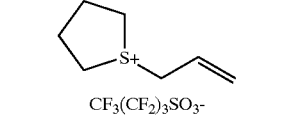
(PAG4-87)
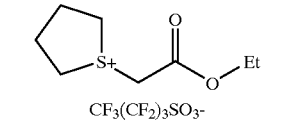
(PAG4-88)
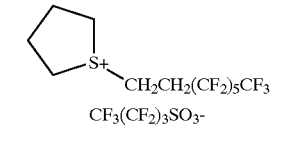
(PAG4-89)
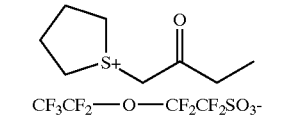
(PAG4-90)
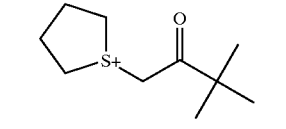
(PAG4-91)
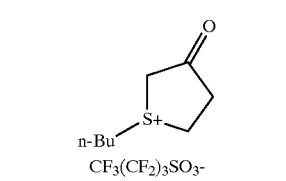
(PAG4-92)
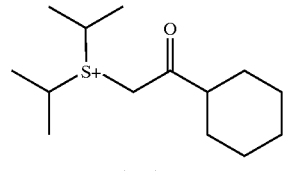
(PAG4-93)
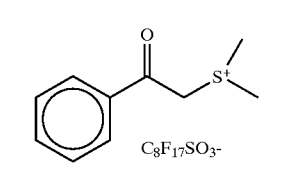

-continued (PAG4-94)
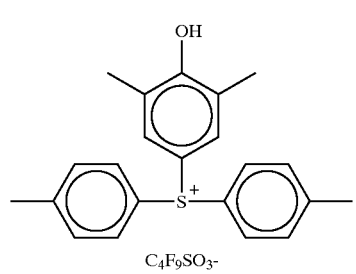

(PAG4-95)
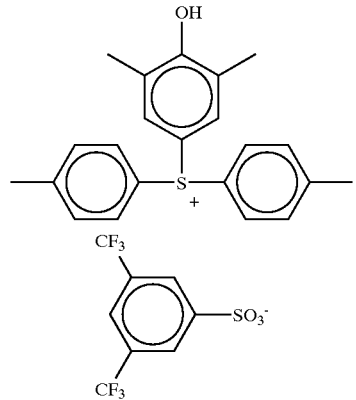

(PAG4-96)
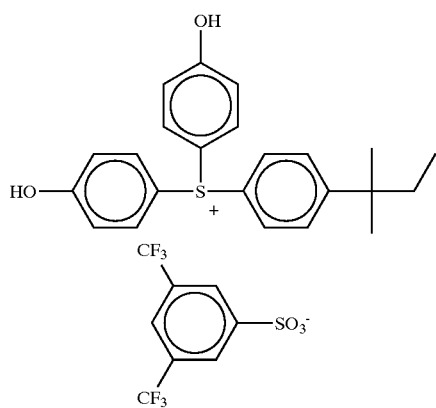

The onium salts represented by formulae (PAG3) and (PAG4) are known compounds, which can be synthesized by the processes taught in U.S. Pat. Nos. 2,807,648 and 4,247,473 and JP-A-53-101331.

(B3) Disulfone derivatives represented by formula (PAG5) and iminosulfonate derivatives represented by formula (PAG6):

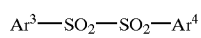 (PAG5)

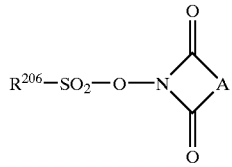 (PAG6)

wherein $Ar^3$ and $Ar^4$ each represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Illustrative examples of the group (B3) compound are listed below.

(PAG5-1)
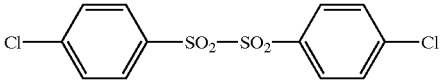

(PAG5-2)
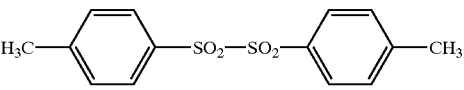

(PAG5-3)
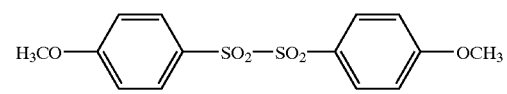

(PAG5-4)
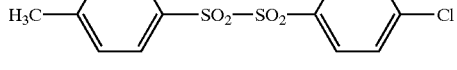

(PAG5-5)
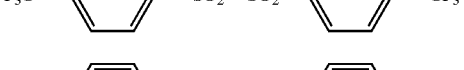

(PAG5-6)

(PAG5-7)
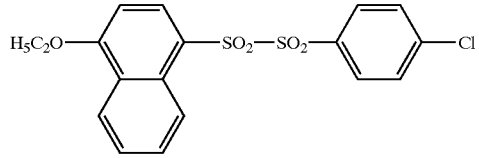

(PAG5-8)
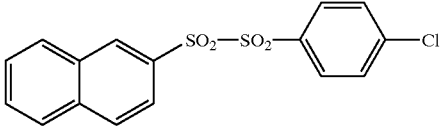

(PAG5-9)
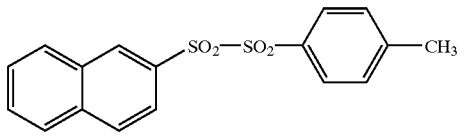

(PAG5-10)
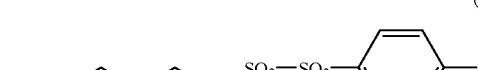

(PAG5-11)
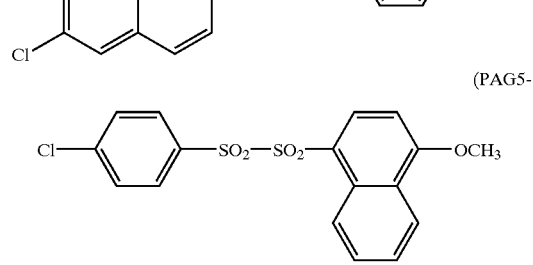

(PAG5-12) 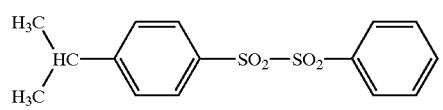
(PAG5-13) 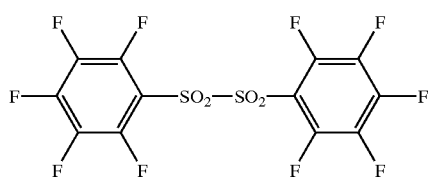
(PAG5-14) 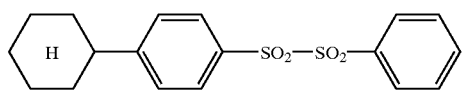
(PAG5-15) 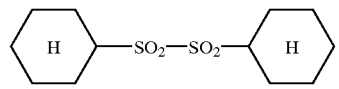
(PAG6-1) 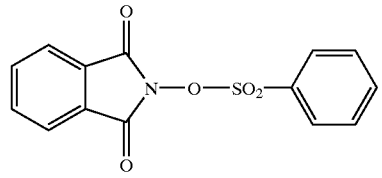
(PAG6-2) 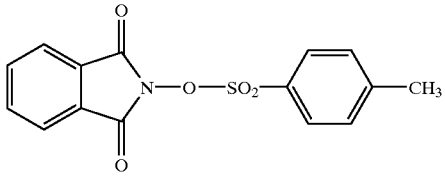
(PAG6-3) 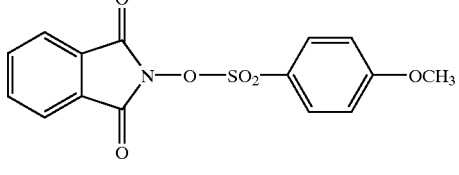
(PAG6-4) 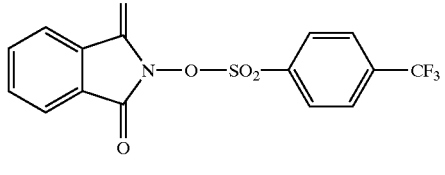
(PAG6-5) 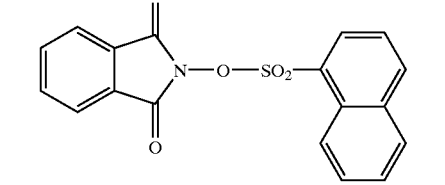
(PAG6-6) 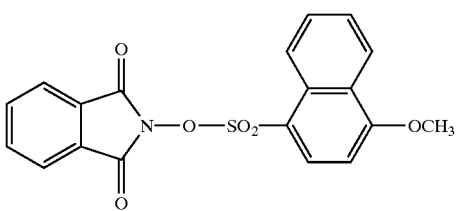
(PAG6-7) 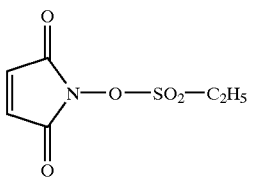
(PAG6-8) 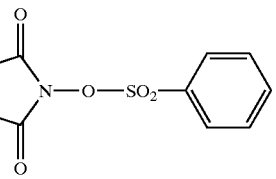
(PAG6-9) 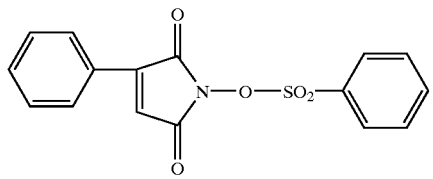
(PAG6-10) 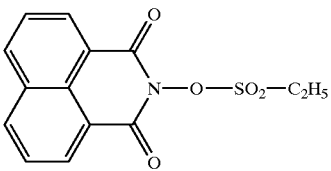
(PAG6-11) 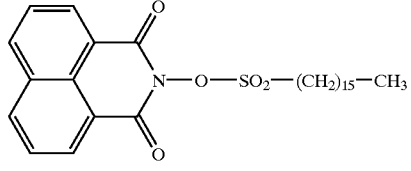
(PAG6-12) 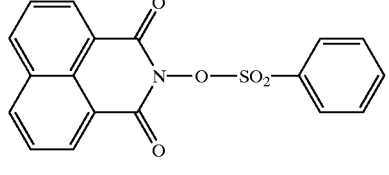
(PAG6-13) 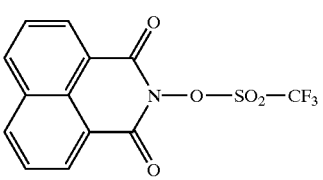

-continued
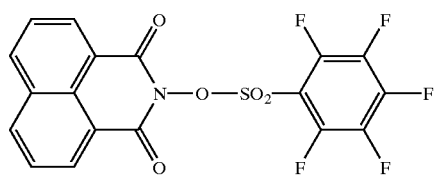
(PAG6-14)
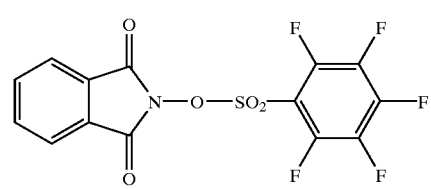
(PAG6-15)
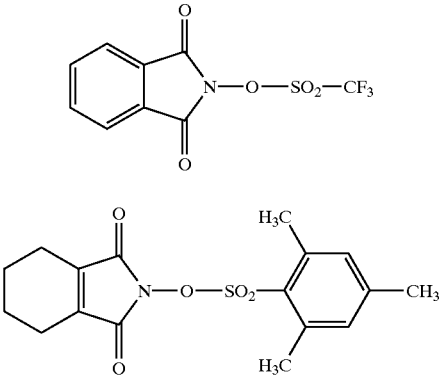
(PAG6-16)
(PAG6-17)
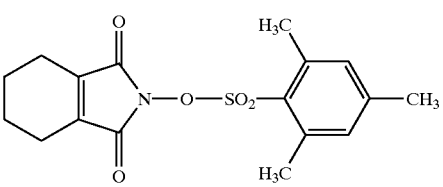
(PAG6-18)
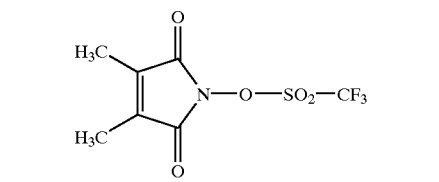
(PAG6-19)
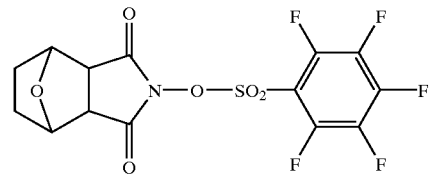
(PAG6-20)
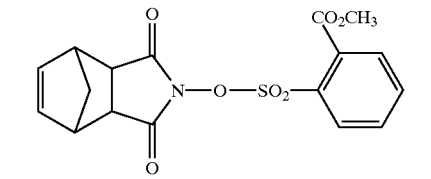
(PAG6-21)
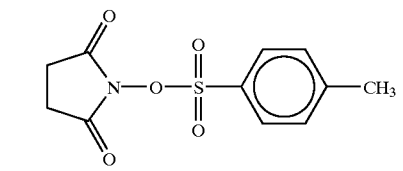
-continued
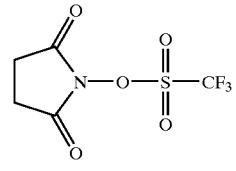
(PAG6-22)
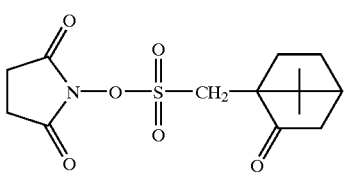
(PAG6-23)
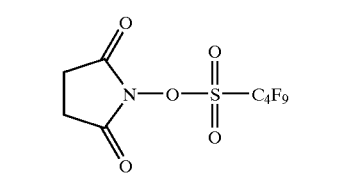
(PAG6-24)
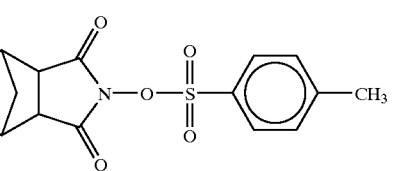
(PAG6-25)
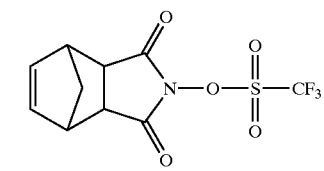
(PAG6-26)
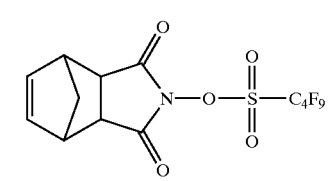
(PAG6-27)
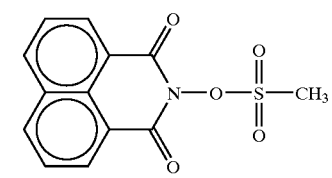
(PAG6-28)
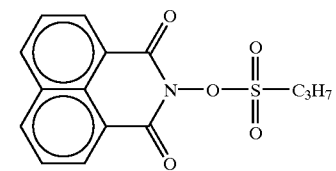
(PAG6-29)
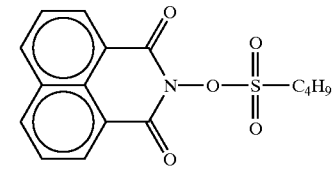
(PAG6-30)

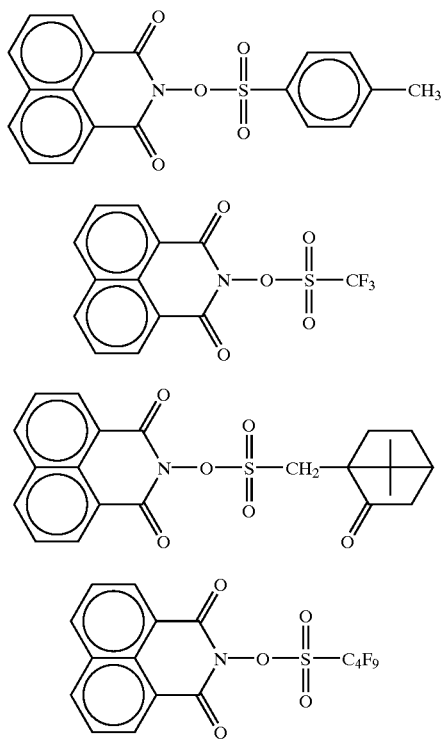

(PAG6-31)

(PAG6-32)

(PAG6-33)

(PAG6-34)

(B4) Diazodisulfone derivatives represented by formula (PAG7):

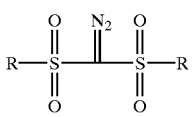

(PAG7)

wherein R represents a straight-chain, branched or cyclic alkyl group or a substituted or unsubstituted aryl group.

Illustrated examples of the group (B4) compounds are shown below.

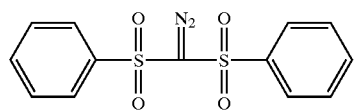

(PAG7-1)

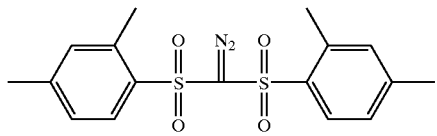

(PAG7-2)

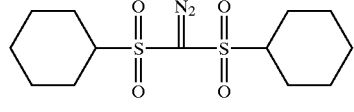

(PAG7-3)

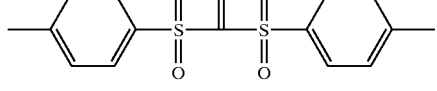

(PAG7-4)

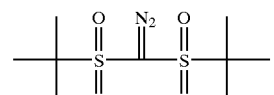

(PAG7-5)

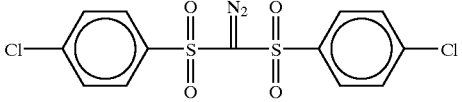

(PAG7-6)

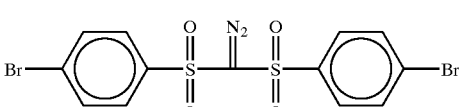

(PAG7-7)

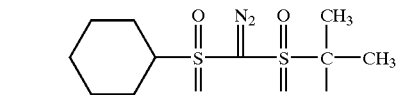

(PAG7-8)

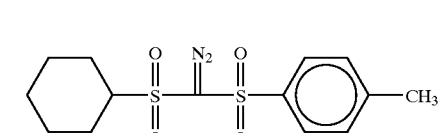

(PAG7-9)

The photo-acid generator as component (B) is usually used in an amount of 0.01 to 30% by weight, preferably 0.3 to 20% by weight, still preferably 0.5 to 10% by weight, based on the solids content of the total resist composition. Amounts of component (B) less than 0.01% tend to result in reduced sensitivity. Amounts exceeding 30% can result in excessive light absorption, leading to deteriorated profile and narrowed process (particularly baking) latitude.

The positive resist composition of the invention can contain various additives according to necessity, such as surface active agents, organic basic compounds, acid-decomposable compounds suppressing dissolution, dyes, plasticizers, photosensitizers, and compounds accelerating dissolution in a developing solution.

The surface active agents which can be preferably used in the invention include fluorine-containing ones, silicon-containing ones, and those containing both fluorine and silicon. They can be used either individually or as a combination thereof. The positive resist composition containing the acid-degradable resin and the fluorine- and/or silicon-containing surface active agent(s) is specially effective for reducing development defects in forming a resist pattern with a small line width.

Examples of the fluorine- and/or silicon-containing surface active agents are described, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511, and 5,824,451. Commercially available fluorine- and/or silicon-containing surface active agents which can be used in the present invention include EFTOP series EF301 and EF303 (from Shin Akita Kasei K. K.); Fluorad series FC430 and FC431 (from Sumitomo 3M Ltd.); Megafac series F171, F173, F176, F189, and R08 (from Dainippon Ink & Chemicals Inc.); Surflon series S-382, SC101, 102, 103, 104, 105 and 106 (from Asahi Glass Co., Ltd.); and Troy Sol S-366

(from Troy Chemical Industries, Inc.). Polysiloxane resin KP-341 (from Shin-Etsu Chemical Co., Ltd.) is also useful as a silicon-containing surface active agent.

The above-described surface active agents are used in an amount of 0.001 to 2% by weight, preferably 0.01 to 1% by weight, based on the solids content of the resist composition. These surface active agents can be used either individually or as a combination of two or more thereof.

In addition to the fluorine- and/or silicon-containing surface active agents, the resist composition can contain nonionic surface active agents. Suitable nonionic surface active agents include polyoxyethylene alkyl ethers, e.g., polyoxyethylene lauryl ether, polyoxyethylene stearyl ether, polyoxyethylene cetyl ether, and polyoxyethylene oleyl ether; polyoxyethylene alkylaryl ethers, e.g., polyoxyethylene octylphenyl ether and polyoxyethylene nonylphenyl ether; ethylene oxide-propylene oxide block copolymers; sorbitan fatty acidesters, e.g., sorbitanmonolaurate, sorbitan monopalmitate, sorbitan monostearate, sorbitan monooleate, sorbitan trioleate, and sorbitan tristearate; polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate. These nonionic surface active agents can be used in an amount usually of 2% by weight or less, preferably 1% by weight or less, based on the solids content of the resist composition.

The organic basic compound which can be used in the invention is preferably an organic compound that is more basic than phenol. Nitrogen-containing basic compounds, particularly those represented by structures (a) to (e) shown below are preferred.

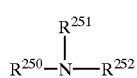
(a)

wherein $R^{250}$, $R^{251}$, and $R^{252}$ each represent a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms; $R^{251}$ and $R^{252}$ may be taken together to form a ring.

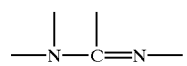
(b)

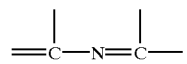
(c)

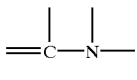
(d)

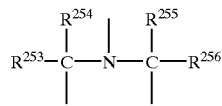
(e)

wherein $R^{253}$, $R^{254}$, $R^{255}$, and $R^{256}$ each represent an alkyl group having 1 to 6 carbon atoms.

Still preferred basic compounds are nitrogen-containing basic compounds having two or more nitrogen atoms in different chemical environments per molecule, particularly compounds having a substituted or unsubstituted amino group and a nitrogen-containing cyclic structure and compounds having an alkylamino group. Preferred examples of such basic compounds are substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. Preferred substituents in these compounds include amino, aminoalkyl, alkylamino, aminoaryl, arylamino, alkyl, alkoxy, acyl, acyloxy, aryl, aryloxy, nitro, hydroxyl, and cyano.

Preferred examples of the nitrogen-containing basic compounds include, but are not limited to, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-azabicyclo[4.3.0]non-5-ene, 1,8-diazabicyclo[5.4.0]undec-7-ene, 1,4-azabicyclo[2.2.2]octane, 2,4,5-triphenylimidazole, N-methylmorpholine N-hydroxyethylmorpholine, N-benzylmorpholine, tertiary morpholine derivatives (e.g., cyclohexylmorpholinoethyl thiourea (CHMETU)), and hindered amines described in JP-A-11-52575 (e.g., those described in paragraph [0005]).

Of the nitrogen-containing basic compounds recited above preferred are 1,5-azabicyclo[4.3.0]non-5-ene, 1,8-diazabicyclo[5.4.0]undec-7-ene, 1,4-diazabicyclo[2.2.2]octane, 4-dimethylaminopyridine, hexamethylenetramine, 4,4-dimethylimidazoline, pyrroles, pyrazoles, imidazoles, pyridazines, pyrimidines, tertiary morpholine derivatives (e.g., CHMETU), and hindered amines (e.g., bis(1,2,2,6,6-pentamethyl-4-piperidyl) sebacate). Particularly preferred are 1,5-diazabicyclo[4.3.0]non-5-ene, 1,8-diazabicyclo[5.4.0]undec-7-ene, 1,4-diazabicyclo[2.2.2]octane, 4-dimethylaminopyridine, hexamethylenetetramine, CHMETU, and bis(1,2,2,6,6-pentamethyl-4-piperidyl) sebacate.

The nitrogen-containing basic compounds can be used either individually or as a combination of two or more thereof. The nitrogen-containing basic compounds are usually used in a total amount of 0.001 to 10% by weight, preferably 0.01 to 5% by weight, based on the solids content of the resist composition. When added in amounts less than 0.001%, the compound produces insubstantial effects of addition. Amounts more than 10% can result in reduction of sensitivity or developability of exposed areas.

The positive resist composition of the invention is dissolved in a solvent capable of dissolving the above-described components to prepare a coating composition, which is applied to a substrate. Suitable solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME), propylene glycol monomethyl ether acetate (PGMEA), ethylene carbonate, toluene, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents can be used either individually or as a mixture thereof.

Preferred of these solvents are propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, methyl lactate, ethyl lactate, methyl methoxypropionate, ethyl ethoxypropionate, N-methylpyrrolidone, and tetrahydrofuran.

The positive resist composition as diluted with the solvent is applied to a substrate to form a thin coating film having a dry thickness of 0.2 to 1.2 μm. The substrate includes ordinary bare silicon wafers, SOG substrates, and substrates having an inorganic antireflective coat. If desired, commercially available inorganic or organic antireflective coatings can be utilized.

The antireflective coatings are divided into inorganic ones, such as titanium, titanium dioxide, titanium nitride, chromium oxide, carbon, and α-silicon; and organic ones made of a light absorber and a polymer. Application of the former requires such equipment as a vacuum evaporation system, a CVD system or a sputtering system. The latter includes a composition comprising a condensate of a diphenylamine derivative and a formaldehyde-modified melamine resin, an alkali soluble resin, and a light absorber which is disclosed in JP-B-7-69611 (the term "JP-B" as used herein means an "examined Japanese patent publication"), a reaction product of a maleic anhydride copolymer and a diamine type light absorber which is disclosed in U.S. Pat. No. 5,294,680, a composition comprising a binder resin and a methylolmelamine-based thermal crosslinking agent which is disclosed in JP-A-6-118631, an acrylic resin composition in which the acrylic resin contains a carboxyl group, an epoxy group, and a light absorbing group in the molecule which is disclosed in JP-A-6-118656, a composition comprising methylolmelamine and a benzophenone light absorber disclosed in JP-A-8-87115, and a composition comprising a polyvinyl alcohol resin and a low-molecular light absorber disclosed in JP-A-8-179509.

Commercially available organic antireflective coatings include DUV 30 series, DUV-40 series, and ARC25 all supplied by Brewer Science Ltd. and AC-2, AC-3, AR19, and AR20 all supplied by Shipley.

Patterning of the resist film in the production of, for example, precise IC devices is performed as follows. The coating composition is applied to a substrate, such as a silicone substrate with a silicon dioxide coat (and, if desired, with the antireflective coat), by an appropriate coating means, such as a spinner or a coater, to form a resist film. The resist film is exposed to light through a prescribed mask. After post-exposure baking, the resist is developed with an alkali developing solution to remove the exposed area. The light of exposure preferably has a wavelength between 150 nm and 250 nm. Suitable light includes a light beam of a KrF excimer laser (248 nm), an ArF excimer laser (193 nm) or an $F_2$ excimer laser (157 nm), X-rays, and an electron beam.

The alkali developing solution includes aqueous alkali solutions. The alkali includes inorganic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and methyldiethylamine; alcohol amines, such as dimethylethanolamine and triethanolamine; quaternary ammonium salts, such as tetramethylammonium hydroxide and tetraethyl ammonium hydroxide; and cyclic amines, such as pyrrole and piperidine. The aqueous alkali solution may contain an adequate amount of an alcohol or a surface active agent.

EXAMPLES

The present invention will now be illustrated in greater detail with reference to Examples, but it should be understood that the invention is by no means limited thereto. Unless otherwise noted, all the percents and ratios are given by weight.

Synthesis Example 1

Synthesis of Resin (1)

2-Methoxybutyl-2-adamantyl acrylate, norbornane lactone methacrylate, and dihydroxyadamantyl methacrylate were put into a vessel in a ratio of 40/40/20 and dissolved in a 70/30 mixed solvent of propylene glycol monomethyl ether acetate (PGMEA)/propylene glycol monomethyl ether (PGME) to prepare 450 g of a 22% monomer solution. An initiator V-601 (available from Wako Pure Chemical Industries, Ltd.) was added in an amount of 1 mol % based on the total mole number of the monomers. The resulting mixture was added dropwise to 40 g of a 70/30 mixed solvent of PGMEA/PGME heated to 100° C. over 6 hours in a nitrogen atmosphere. After the addition, the reaction mixture was stirred for 4 hours. After completion of the reaction, the reaction mixture was cooled to room temperature and poured into 5 liters of a 10/1 mixture of hexane/ethyl acetate to precipitate white powder. The powder was collected by filtration and re-slurried in 1 liter of methanol to recover resin (1).

As a result of NMR analysis, the copolymerization ratio of 2-methoxybutyl-2-adamantyl acrylate/norbornane lactone methacrylate/dihydroxyadamantyl methacrylate was found to be 39/40/21. GPC analysis revealed that resin (1) had a polystyrene equivalent weight average molecular weight (Mw) of 9700.

Resins (2) to (8) shown below were synthesized in the same manner as for resin (1). The copolymerization ratios and the molecular weights of resins (2) to (8) are shown in Table 1 below, in which the order of the repeating units from left to right is the same as that in the structural formula.

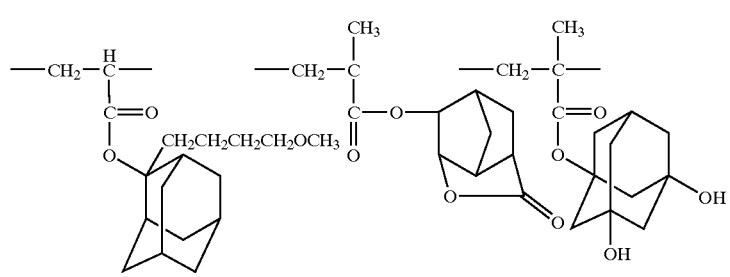
(1)
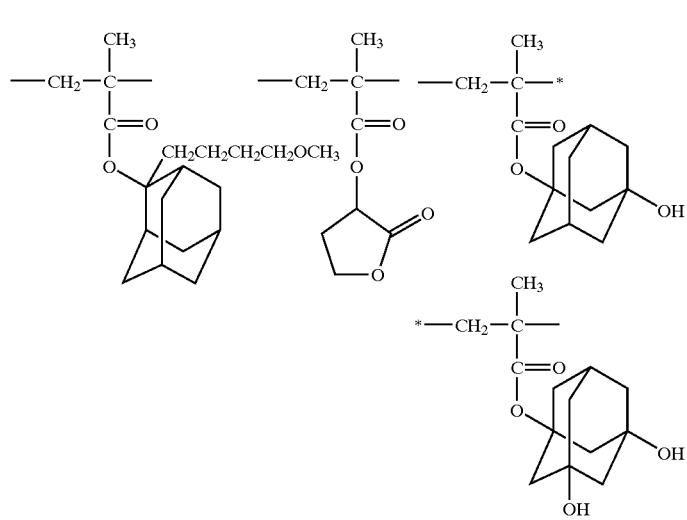
(2)
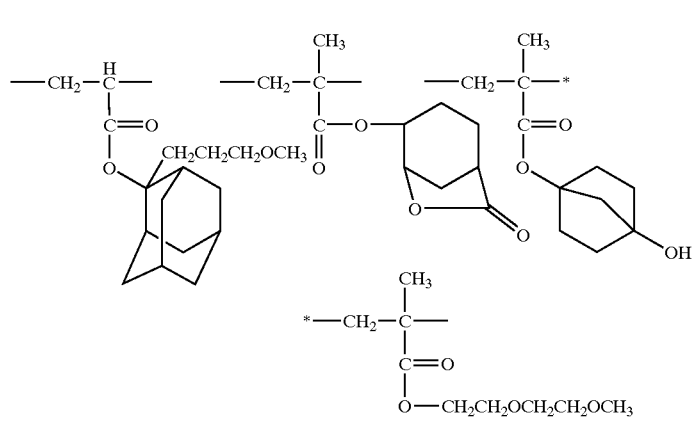
(3)
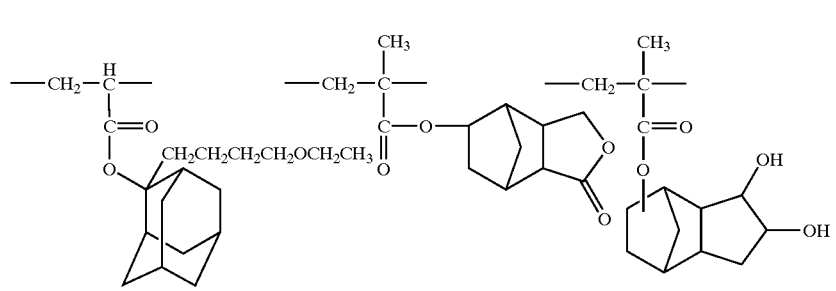
(4)

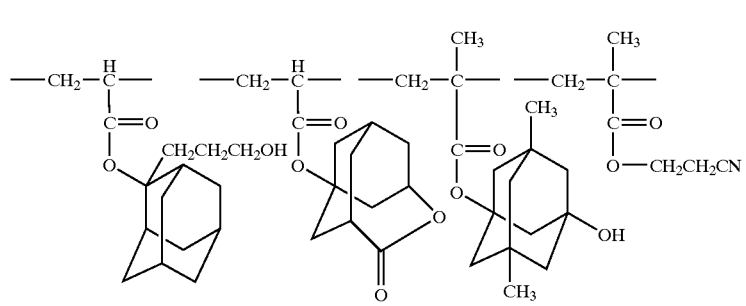
(5)
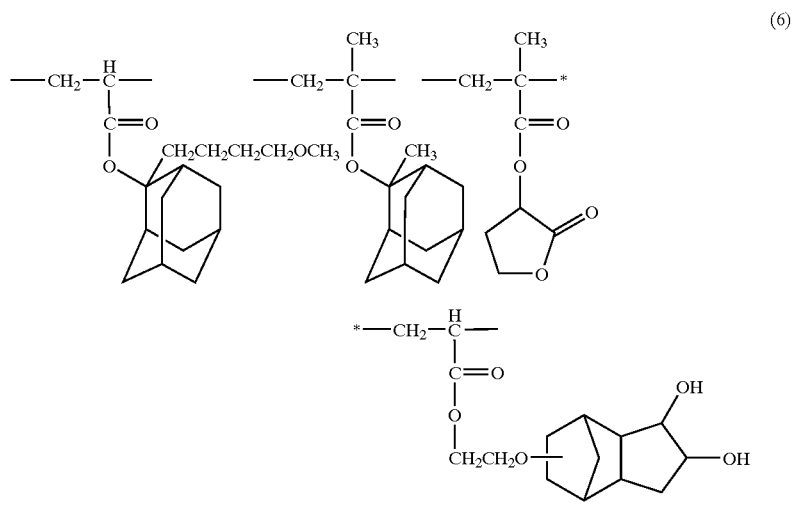
(6)
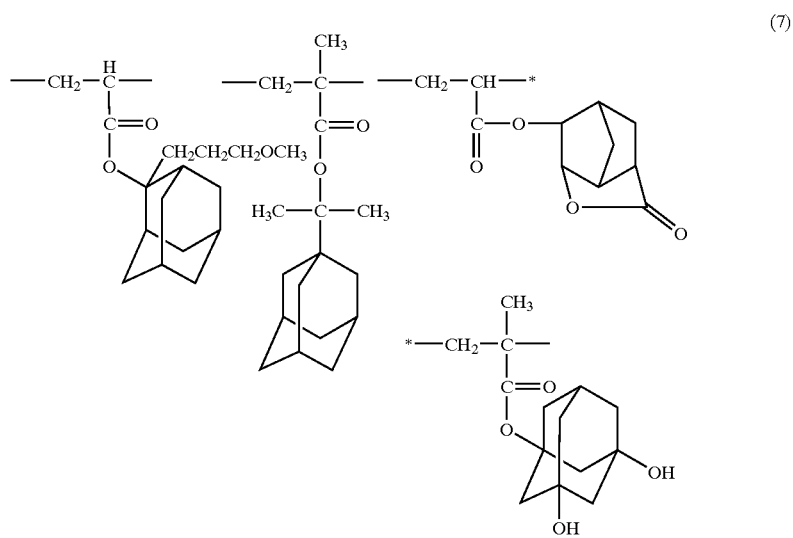
(7)

-continued

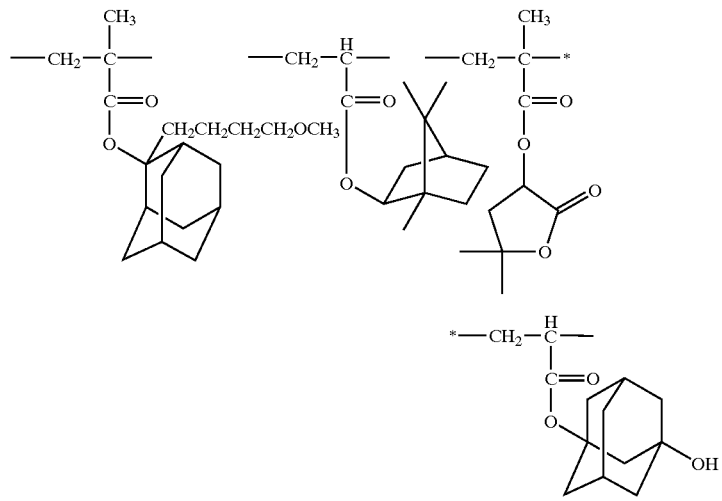

(8)

TABLE 1

| Resin | Repeating Unit (I) (mol %) | 2nd Repeating unit (mol %) | 3rd Repeating Unit (mol %) | 4th Repeating Unit (mol %) | Mw |
|---|---|---|---|---|---|
| 2 | 37 | 21 | 26 | 16 | 9800 |
| 3 | 32 | 33 | 31 | 4 | 12500 |
| 4 | 34 | 46 | 20 |   | 10200 |
| 5 | 39 | 12 | 36 | 13 | 13600 |
| 6 | 21 | 20 | 36 | 23 | 10100 |
| 7 | 26 | 10 | 45 | 19 | 9900 |
| 8 | 34 | 14 | 32 | 20 | 9400 |

Examples 1 to 12 and Comparative Example 1

1) Preparation of Positive Resist Coating Composition

According to the formulation shown in Table 2 below, an indicated amount of a resin, an indicated amount of a photo-acid generator, 4 mg of an organic basic compound, and (in Examples) 10 mg of a surface active agent were compounded and dissolved in a solvent to make a 14% solution. The resin solution was microfiltered through a membrane filter having an opening size of 0.1 μm to prepare a coating composition. The mixing ratios of the mixed basic compounds and the mixed solvents shown in Table 2 are by weight.

TABLE 2

| Example | Resin | Photo-acid Generator | Basic Compound | Sur-factant | Solvent |
|---|---|---|---|---|---|
| 1 | (1) = 2 g | PAG4–48/PAG4–65 = 15/60 mg | E1/E2 = 1/1 | W5 | S1/S2 = 7/3 |
| 2 | (2) = 2 g | PAG4–52/PAG4–65/PAG4–82 = 20/30/10 mg | E3 | W5 | S1/S2 = 7/3 |
| 3 | (3) = 2 g | PAG4–39 = 42 mg | E5 | W5 | S1/S2 = 7/3 |
| 4 | (4) = 2 g | PAG4–52/PAG4–65 = 25/40 mg | E6 | W5 | S1/S2 = 7/3 |
| 5 | (5) = 2 g | PAG4–41/PAG4–96 = 42/3 mg | E4 | W5 | S1/S2 = 8/2 |
| 6 | (6) = 2 g | PAG4–6/PAG4–70 = 30/20 mg | E4/E5 = 1/1 | W1 | S1/S2/S3 = 7/2/1 |
| 7 | (7) = 2 g | PAG4–52/PAG4–82 = 45/5 mg | E6 | W2 | S1/S4 = 7/3 |
| 8 | (8) = 2 g | PAG4–45/PAG4–92 = 40/10 mg | E2 | W3 | S4/S5 = 6/4 |
| 9 | (1)/(b) = 1.7/0.3 g | PAG4–17 = 42 mg | E2 | W4 | S6/S2 = 7/3 |
| 10 | (2)/(a) = 1.2/0.8 g | PAG4–50/PAG4–94 = 40/5 mg | E2 | W5 | S1/S2 = 6/4 |
| 11 | (4)/(c) = 0.8/1.2 g | PAG4–6/PAG4–79 = 40/10 mg | E2 | W5 | S1/S2 = 6/4 |

TABLE 2-continued

| Example | Resin | Photo-acid Generator | Basic Compound | Sur-factant | Solvent |
|---|---|---|---|---|---|
| 12 | (1)/(c) = 0.4/1.6 g | PAG4–48 = 43 mg | E2/E6 = 1/1 | W5 | S1/S2 = 6/4 |
| Compa. Example 1 | R1 = 2 g | PAG4–5 = 40 mg | E1 | none | S1 |

The materials shown in Table 2 except resins (1) to (8) are:

Surface Active Agent

W1: Megafac F176 (F-containing surfactant available from Dainippon Ink & Chemicals Inc.)

W2: Megafac R08 (F- and Si-containing surfactant from Dainippon Ink & Chemical)

W3: Polysiloxane KP-341 (Si-containing surfactant from Shin-Etsu Chemical Co., Ltd.)

W4: Polyoxyethylene nonylphenyl ether

W5: Troy Sol S-366 (from Troy Chemical Industries, Inc.).

Basic Compound

E1: 1,5-Diazabicyclo[4.3.0]non-5-ene (DBN)

E2: N,N-Bis(2-hydroxyethyl)aniline

E3: Trioctylamine

E4: Triphenylimidazole

E5: Antipyrine

E6: 2,6-Diisopropylaniline

Solvent

S1: Propylene glycol monomethyl ether acetate

S2: Propylene glycol monomethyl ether

S3: γ-Butyrolactone

S4: Ethyl lactate

S5: Butyl acetate

S6: 2-Heptanone

Resins Used in Combination

Resin (a):

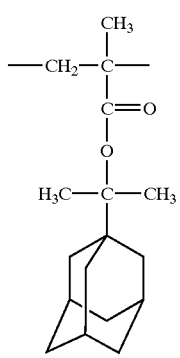
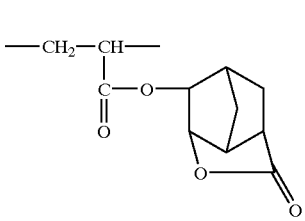

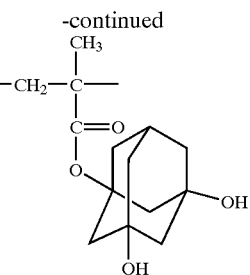

Resin (b):

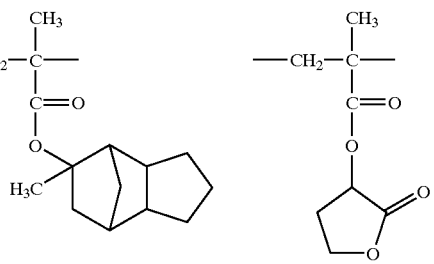

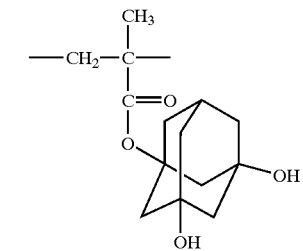

Resin (c):

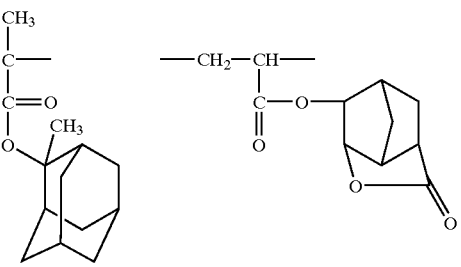

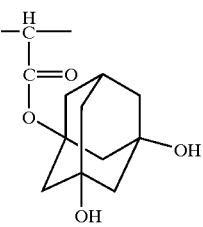

Resins (a), (b), and (c) were synthesized as follows.

Synthesis of Resin (a):

2-Adamantyl-2-propyl methacrylate, norbornane lactone acrylate, and dihydroxyadamantyl methacrylate were put into a vessel in a ratio of 35/45/20 and dissolved in a 60/40 mixed solvent of PGMEA/PGME to prepare 450 g of a 22% monomer solution. An initiator V-601 (from Wako Pure Chemical) was added in an amount of 1 mol % based on the total mole number of the monomers. The resulting mixture was added dropwise to 40 g of a 70/30 mixed solvent of PGMEA/PGME heated to 100° C. over 6 hours in a nitrogen atmosphere. After the addition, the reaction mixture was stirred for 4 hours. After completion of the reaction, the reaction mixture was cooled to room temperature and poured into 5 liters of a 9/1 mixture of hexane/ethyl acetate to precipitate white powder. The powder was collected by filtration and re-slurried in 1 liter of methanol to recover resin (a).

As a result of NMR analysis, the copolymerization ratio of 2-adamantyl-2-propyl methacrylate/norbornane lactone acrylate/dihydroxyadamantyl methacrylate was found to be 34/44/22. GPC analysis revealed that resin (a) had a polystyrene equivalent weight average molecular weight of 8700.

Synthesis of Resin (b):

8-Methyl-8-tricyclodecanyl methacrylate, α-hydroxy-γ-butyrolactone methacrylate, and dihydroxyadamantyl methacrylate were put into a vessel in a ratio of 45/35/20 and dissolved in a 60/40 mixed solvent of PGMEA/PGME to prepare 450 g of a 22% monomer solution. An initiator V-601 (from Wako Pure Chemical) was added in an amount of 1 mol % based on the total mole number of the monomers. The resulting mixture was added dropwise to 40 g of a 70/30 mixed solvent of PGMEA/PGME heated to 100° C. over 6 hours in a nitrogen atmosphere. After the addition, the reaction mixture was stirred for 4 hours. After completion of the reaction, the reaction mixture was cooled to room temperature and poured into 5 liters of a 9/1 mixture of hexane/ethyl acetate to precipitate white powder. The powder was collected by filtration and re-slurried in 1 liter of methanol to recover resin (b).

As a result of NMR analysis, the copolymerization ratio of 8-methyl-8-tricyclodecanyl methacrylate/α-hydroxy-γ-butyrolactone methacrylate/dihydroxyadamantyl methacrylate was found to be 46/34/20. GPC analysis revealed that resin (b) had a polystyrene equivalent weight average molecular weight of 9200.

Synthesis of Resin (c):

2-Methyl-2-adamantyl methacrylate, norbornane lactone acrylate, and dihydroxyadamantyl acrylate were put into a vessel in a ratio of 40/40/20 and dissolved in a 60/40 mixed solvent of PGMEA/PGME to prepare 450 g of a 22% monomer solution. An initiator V-601 (from Wako Pure Chemical) was added in an amount of 1 mol % based on the total mole number of the monomers. The resulting mixture was added dropwise to 40 g of a 60/40 mixed solvent of PGMEA/PGME heated to 100° C. over 6 hours in a nitrogen atmosphere. After the addition, the reaction mixture was stirred for 4 hours. After completion of the reaction, the reaction mixture was cooled to room temperature and poured into 5 liters of a 9/1 mixture of hexane/ethyl acetate to precipitate white powder. The powder was collected by filtration and re-slurried in 1 liter of methanol to recover resin (c).

As a result of NMR analysis, the copolymerization ratio of 2-methyl-2-adamantyl methacrylate/norbornane lactone acrylate/dihydroxyadamantyl acrylate was found to be 40/39/21. GPC analysis revealed that resin (c) had a polystyrene equivalent weight average molecular weight of 9700.

Resin R1 used in Comparative Example 1 was a resin having the following repeating units which was synthesized in accordance with Synthesis Example 8 of JP-A-2001-109154:

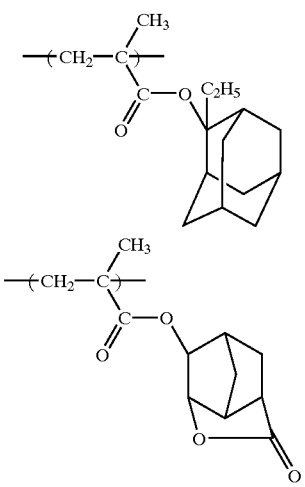

2) Evaluation on LER

An antireflective coating ARC-29 available from Brewer Science Ltd. was applied to a silicon wafer with a spin coater to a coating thickness of 85 nm and dried. The coating composition prepared in (1) above was applied to the antireflective coat and dried at 125° C. for 90 seconds to form a 0.3 μm thick resist film.

The resist film on the wafer was exposed to ArF excimer laser light at a varied dose through a resolution chart (mask) by use of Stepper 9300 supplied by ISI. After post-exposure baking at 125° C. for 90 seconds in a clean room, the resist film was developed with a 2.38% tetramethylammonium hydroxide developing solution for 60 seconds, rinsed with distilled water, and dried to form a resist pattern.

A 125 nm wide line patterned at the minimum exposure dose capable of reproducing a 125 nm wide line of the chart was inspected for LER by measuring the distance of the edge from a reference line (where the edge should have been) at 50 points within a length of 5 μm with a CD-SEMS-9220 supplied from Hitachi,. Ltd. A standard deviation was obtained to calculate 3σ. A smaller 3σ value means a smaller LER. The results obtained are shown in Table 3 below.

TABLE 3

|  | LER (nm) |
|---|---|
| Example 1 | 6 |
| Example 2 | 6.5 |
| Example 3 | 7 |
| Example 4 | 6.5 |
| Example 5 | 6.5 |
| Example 6 | 7.5 |
| Example 7 | 7 |
| Example 8 | 7.5 |
| Example 9 | 6.5 |
| Example 10 | 6.5 |

TABLE 3-continued

|  | LER (nm) |
|---|---|
| Example 11 | 7 |
| Example 12 | 8 |
| Comparative Example 1 | 14 |

The results of Table 3 prove that the resist compositions according to the present invention have markedly reduced LER.

The present invention provides a positive resist composition which forms a resist pattern with markedly reduced LER.

This application is based on Japanese Patent application JP 2002-044665, filed Feb. 21, 2002, the entire content of which is hereby incorporated by reference, the same as if set forth at length.

What is claimed is:

1. A positive resist composition comprising:

(A) a resin which comprises a repeating unit represented by the following formula (I):

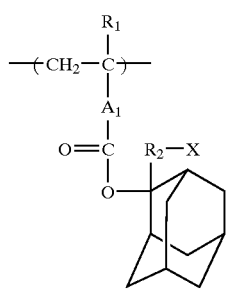

(I)

wherein $R_1$ represents a hydrogen atom or an alkyl group, $A_1$ represents a single bond or a linking group, $R_2$ represents an alkylene group, and X represents an alkoxy group or a hydroxyl group, and exhibits an increased rate of dissolution in an alkali developing solution by an action of an acid; and (B) a compound capable of generating an acid on exposure to active light rays or a radiation.

2. The positive resist composition according to claim 1, wherein the resin (A) further comprises a repeating unit represented by the following formula (II):

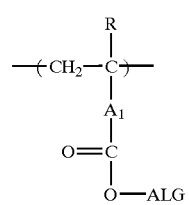

(II)

wherein R represents a hydrogen atom or a methyl group; $A_2$ represents a single bond or a linking group; and ALG represents an alicyclic hydrocarbon group-containing group represented by the following formula (pI), (pII), (pIII), (pIV) or (pV):

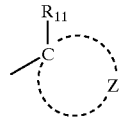

(pI)

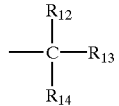

(pII)

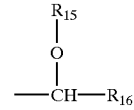

(pIII)

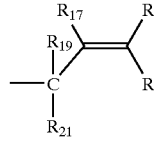

(pIV)

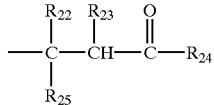

(pV)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with an adjacent carbon atom; $R_{12}$, $R_{13}$, $R_{14}$, $R_{15}$, and $R_{16}$ each independently represent a straight-chain or branched alkyl group having 1 to 4 carbon atoms or an alicyclic hydrocarbon group, provided that at least one of $R_{12}$, $R_{13}$, and $R_{14}$ and at least one of $R_{15}$ and $R_{16}$ represent an alicyclic hydrocarbon group; $R_{17}$, $R_{18}$, $R_{19}$, $R_{20}$, and $R_{21}$ each independently represent a hydrogen atom, a straight-chain or branched alkyl group having 1 to 4 carbon atoms or an alicyclic hydrocarbon group, provided that at least one of $R_{17}$, $R_{18}$, $R_{19}$, $R_{20}$, and $R_{21}$ represents an alicyclic hydrocarbon group and that at least one of $R_{19}$ and $R_{21}$ represents a straight-chain or branched alkyl group having 1 to 4 carbon atoms or an alicyclic hydrocarbon group; and $R_{22}$, $R_{23}$, $R_{24}$, and $R_{25}$ each independently represent a straight-chain or branched alkyl group having 1 to 4 carbon atoms or an alicyclic hydrocarbon group, provided that at least one of $R_{22}$, $R_{23}$, $R_{24}$, and $R_{25}$ represents an alicyclic hydrocarbon group; and $R_{23}$ and $R_{24}$ may be connected together to form a ring.

3. The positive resist composition according to claim 2, wherein, in formula (II), $A_2$ is a single bond, and ALG is a group represented by the following formula:

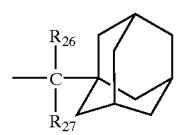

wherein $R_{26}$ and $R_{27}$ each independently represent a straight-chain or branched alkyl group having 1 to 4 carbon atoms.

4. The positive resist composition according to claim 1, wherein the resin (A) further comprises a repeating unit represented by the following formula (III):

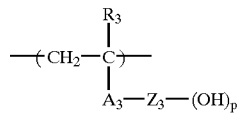
(III)

wherein $R_3$ represents a hydrogen atom or a methyl group; $A_3$ represents a single bond or a divalent linking group; $Z_3$ represents an alicyclic hydrocarbon group having a valence of (p+1); and p represents an integer of 1 to 3.

5. The positive resist composition according to claim 4, wherein the resin (A) further comprises a repeating unit having a cyclohexane lactone moiety, a norbornane lactone moiety or an adamantane lactone moiety.

6. The positive resist composition according to claim 5, wherein the repeating unit represented by formula (III) is a repeating unit represented by the following formula (IIIa):

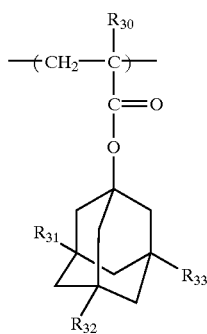
(IIIa)

wherein $R_{30}$ represents a hydrogen atom or a methyl group; and $R_{31}$, $R_{32}$, and $R_{33}$ each independently represent a hydrogen atom, a hydroxyl group or an alkyl group, provided that at least one of $R_{31}$, $R_{32}$, and $R_{33}$ is a hydroxyl group.

7. The positive resist composition according to claim 6, wherein at least two of $R_{31}$, $R_{32}$, and $R_{33}$ each represent a hydroxyl group.

8. The positive resist composition according to claim 4, wherein the repeating unit represented by formula (III) is a repeating unit represented by the following formula (IIIa):

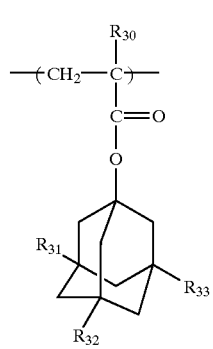
(IIIa)

wherein $R_{30}$ represents a hydrogen atom or a methyl group; and $R_{31}$, $R_{32}$, and $R_{33}$ each independently represent a hydrogen atom, a hydroxyl group or an alkyl group, provided that at least one of $R_{31}$, $R_{32}$, and $R_{33}$ is a hydroxyl group.

9. The positive resist composition according to claim 8, wherein at least two of $R_{31}$, $R_{32}$, and $R_{33}$ each represent a hydroxyl group.

10. The positive resist composition according to claim 1, wherein the resin (A) further comprises a repeating unit having a cyclohexane lactone moiety, a norbornane lactone moiety or an adamantane lactone moiety.

11. The positive resist composition according to claim 1, wherein the resins (A) further comprises a repeating unit having a lactone moiety and represented by the following formula (IV):

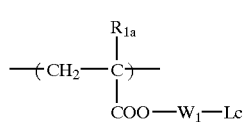
(IV)

wherein $R_{1a}$ represents a hydrogen atom or a methyl group; $W_1$ represents a single bond or one of, or a combination of two or more of, an alkylene group, an ether group, a thioether group, a carbonyl group, and an ester group; Lc represents a lactone structure of the following formula:

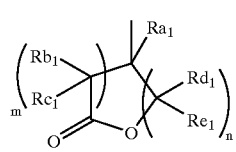
(Lc)

wherein $R_{a1}$, $R_{b1}$, $R_{c1}$, $R_{d1}$, and $R_{e1}$ each independently represent a hydrogen atom or an alkyl group having 1 to 4 carbon atoms; and m and n each independently represent an integer of 0 to 3, provided that m+n is 2 to 6.

* * * * *